United States Patent
Narathong et al.

(10) Patent No.: US 8,462,036 B2
(45) Date of Patent: Jun. 11, 2013

(54) DIGITAL-TO-ANALOG CONVERTER WITH NON-UNIFORM RESOLUTION

(75) Inventors: Chiewcharn Narathong, San Diego, CA (US); Jong Min Park, San Diego, CA (US); Tsai-Pi Hung, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 55 days.

(21) Appl. No.: 12/964,607

(22) Filed: Dec. 9, 2010

(65) Prior Publication Data

US 2012/0146828 A1    Jun. 14, 2012

(51) Int. Cl.
*H03M 1/12*    (2006.01)

(52) U.S. Cl.
USPC ............. 341/154; 348/47; 348/153; 375/238; 375/248; 250/208.1; 702/107; 324/741; 324/723; 331/34

(58) Field of Classification Search
USPC ............. 341/144–160; 348/47, 153; 375/238, 375/248; 250/208.1; 702/107; 324/714, 723; 338/13; 331/34
See application file for complete search history.

(56) References Cited

U.S. PATENT DOCUMENTS

| | | | |
|---|---|---|---|
| 4,281,319 A | | 7/1981 | Roberts, Jr. |
| 5,182,528 A | | 1/1993 | Zuta |
| 5,703,588 A | | 12/1997 | Rivoir et al. |
| 5,825,319 A | * | 10/1998 | Murden et al. .................. 341/132 |
| 5,920,274 A | * | 7/1999 | Gowda et al. .................. 341/155 |
| 6,498,577 B1 | | 12/2002 | Lin |
| 6,704,673 B2 | * | 3/2004 | McTigue et al. .............. 702/107 |
| 6,914,547 B1 | | 7/2005 | Swaroop et al. |
| 7,043,386 B2 | * | 5/2006 | Prabhakaran et al. ........ 702/107 |
| 7,110,025 B1 | * | 9/2006 | Loui et al. .................. 348/220.1 |
| 7,283,082 B1 | | 10/2007 | Kuyel |
| 7,796,060 B2 | * | 9/2010 | Oberhuber et al. ............. 341/94 |
| 7,859,441 B2 | * | 12/2010 | Kang ............................ 341/138 |
| 8,040,268 B2 | * | 10/2011 | Kang ............................ 341/159 |
| 2003/0112167 A1 | | 6/2003 | Bae |

FOREIGN PATENT DOCUMENTS

EP    1542367 A2    6/2005

OTHER PUBLICATIONS

M. Ferriss et al, "A 14mW Fractional-N PLL Modulator with an Enhanced Digital Phase Detector and Frequency Switching Scheme," IEEE International Solid-State Circuits Conference, Feb. 2007.

M. Ferriss et al, "A 14mW Fractional-N PLL Modulator with an Enhanced Digital Phase Detector and Frequency Switching Scheme," (Presentation), IEEE International Solid-State Circuits Conference, Feb. 2007.

International Search Report and Written Opinion—PCT/US2011/064023—ISA/EPO—Jun. 25, 2012.

* cited by examiner

*Primary Examiner* — Lam T Mai
(74) *Attorney, Agent, or Firm* — Ramin Mobarhan

(57) ABSTRACT

A circuit includes a digital-to-analog converter with non-uniform resolution for converting a digital signal into an analog signal. The digital-to-analog converter includes high-resolution circuitry, reduced-resolution circuitry coupled to the high-resolution circuitry and a switch coupled to the high-resolution circuitry and to the reduced-resolution circuitry. The switch couples one of the high-resolution circuitry and the reduced-resolution circuitry to an output node. The circuit also includes a decoder coupled to the switch. The decoder receives the digital signal to control the switch.

17 Claims, 11 Drawing Sheets

DIGITAL-TO-ANALOG CONVERTER WITH NON-UNIFORM RESOLUTION

TECHNICAL FIELD

The present disclosure relates generally to integrated circuits. More specifically, the present disclosure relates to a digital-to-analog converter with non-uniform resolution.

BACKGROUND

The use of electronic devices has greatly increased in recent years. For example, people often use cellular phones, smart phones, computers, music players, televisions and gaming systems, among other electronic devices. The use of electronic devices has become so prevalent that these devices are practically ubiquitous in modern society. The decreasing cost of electronic components has particularly encouraged the widespread use of electronic devices.

Electronic devices are often designed and implemented in a modular fashion. For example, an electronic device may include multiple electronic modules or blocks implemented using electronic components and/or integrated circuitry. These modules or blocks typically provide certain functionality used in the operation of the electronic device.

Integrated circuits may provide differing functions for an electronic device. In particular, some integrated circuits are used for processing digital and/or analog signals. For example, one integrated circuit or a component of an integrated circuit may convert digital signals to analog signals. Other integrated circuits or circuit components may use this conversion functionality to provide oscillating signals and/or phase locking functionality. As can be seen from this discussion, systems and methods that improve performance and/or reduce size of electronic components may be beneficial.

SUMMARY

A circuit is described. The circuit includes a digital-to-analog converter with non-uniform resolution for converting a digital signal into an analog signal. The digital-to-analog converter includes high-resolution circuitry and reduced-resolution circuitry coupled to the high-resolution circuitry. The digital-to-analog converter also includes a switch coupled to the high-resolution circuitry and to the reduced-resolution circuitry. The switch couples one of the high-resolution circuitry and the reduced-resolution circuitry to an output node. A decoder is coupled to the switch. The decoder receives the digital signal to control the switch. The circuit may be an integrated circuit. The decoder may be an X-Y decoder. The digital-to-analog converter may be a single-stage resistor-string digital-to-analog converter.

The reduced-resolution circuitry may include a first resistor with a resistance that is greater than a resistance of a second resistor included in the high-resolution circuitry. The first resistor may have a higher sheet resistance than the second resistor. The high-resolution circuitry may include a first plurality of resistors and the reduced-resolution circuitry may include a second plurality of resistors. The first plurality of resistors may each have a resistance that is smaller than the resistance of each of the second plurality of resistors.

Another circuit is described. The circuit includes a digital-to-analog converter having an input for receiving a digital signal. The circuit also includes a voltage-controlled oscillator coupled to the digital-to-analog converter. The voltage-controlled oscillator includes a capacitor bank coupled to a plurality of switches for adjusting an operating range of the voltage-controlled oscillator. The circuit also includes an operating range controller coupled to the voltage controlled oscillator. The operating range controller is configured to determine whether the digital signal at the digital-to-analog converter input corresponds to a designated operating range. The operating range controller is also configured to control the plurality of switches to adjust the operating range of the voltage-controlled oscillator if the digital signal does not correspond to the designated operating range. The digital-to-analog converter may include high-resolution circuitry and reduced-resolution circuitry. The circuit may be used in conjunction with a modulator. The operating range controller may adjust the operating range by determining a first adjustment based on the digital signal and applying the first adjustment to the voltage-controlled oscillator.

The designated operating range may correspond to a high-resolution operating region of the digital-to-analog converter. The designated operating range may include a range within a high-resolution operating region of the digital-to-analog converter.

The first adjustment may be determined according to the equation $$N_{A1} = \frac{K_{vco}(\text{Hz}/LSB) \times (N_{DAC\_1} - Center)}{K_{acq}(\text{Hz}/LSB)}.$$

$N_{A1}$ is the first adjustment and $K_{vco}$ is a voltage-controlled oscillator gain or tuning sensitivity expressed in hertz (Hz) per least significant bit (LSB). $K_{acq}$ is a gain or tuning sensitivity of an acquisition code expressed in hertz (Hz) per least significant bit (LSB), $N_{DAC\_1}$ is a first digital-to-analog converter input code value from the digital signal and Center is a code value corresponding to a center of the designated operating region.

The operating range controller may determine whether an updated digital signal corresponds to the designated operating range. The operating range controller may also determine a scaled second adjustment based on the first adjustment if the updated digital signal does not correspond to the designated operating range. The operating range controller may also apply the scaled second adjustment to the voltage-controlled oscillator if the updated digital signal does not correspond to the designated operating range.

The scaled second adjustment may be determined according to the equation $\alpha N_{A2}$. $\alpha N_{A2}$ is the second scaled adjustment. $N_{A2}$ is a second adjustment and $$\alpha = \frac{N_{A1}}{N_{A1} - N_{A2}}.$$

$N_{A1}$ is the first adjustment. The second adjustment may be determined according to the equation $$N_{A2} = \frac{K_{vco}(\text{Hz}/LSB) \times (N_{DAC\_2} - Center)}{K_{acq}(\text{Hz}/LSB)}.$$

$N_{A2}$ is the second adjustment and $K_{vco}$ is a voltage-controlled oscillator gain or tuning sensitivity expressed in hertz (Hz) per least significant bit (LSB). $K_{acq}$ is a gain or tuning sensitivity of an acquisition code expressed in hertz (Hz) per least significant bit (LSB), $N_{DAC\_2}$ is a second digital-to-analog converter input code value and Center is a code value corresponding to a center of the designated operating region.

A method for converting a digital signal into an analog signal using a digital-to-analog converter with non-uniform resolution is also disclosed. The method includes receiving a digital signal. The method also includes decoding, by the digital-to-analog converter, the digital signal to produce a control signal. The method also includes providing a voltage to high-resolution circuitry and reduced-resolution circuitry. The method further includes controlling a switch using the control signal to select an output from one of the high-resolution circuitry and the reduced-resolution circuitry. The method also includes providing an analog signal.

A method for controlling an operating range is also disclosed. The method includes receiving a digital signal by a digital-to-analog converter and an operating range controller. The method also includes determining, by the operating range controller, whether the digital signal corresponds to a designated operating range. The method further includes adjusting the operating range of a voltage-controlled oscillator if the digital signal does not correspond to the designated operating range.

A computer-program product for controlling an operating range is also disclosed. The computer-program product includes a non-transitory tangible computer-readable medium with instructions. The instructions include code causing an operating range controller to determine whether a digital signal corresponds to a designated operating range. The instructions also include code for causing the operating range controller to adjust the operating range of a voltage-controlled oscillator if the digital signal does not correspond to the designated operating range.

An apparatus for converting a digital signal into an analog signal is also disclosed. The apparatus includes means for receiving a digital signal. The apparatus also includes means for decoding the digital signal to produce a control signal. The apparatus further includes means for providing a voltage to high-resolution circuitry and reduced-resolution circuitry. Means for controlling a switch using the control signal to select an output from one of the high-resolution circuitry and the reduced-resolution circuitry is also included in the apparatus. The apparatus also includes means for providing an analog signal.

An apparatus for controlling an operating range is also disclosed. The apparatus includes means for receiving a digital signal. The apparatus also includes means for determining whether the digital signal corresponds to a designated operating range. The apparatus further includes means for adjusting an operating range of a voltage-controlled oscillator if the digital signal does not correspond to the designated operating range.

DETAILED DESCRIPTION

Figure 1:
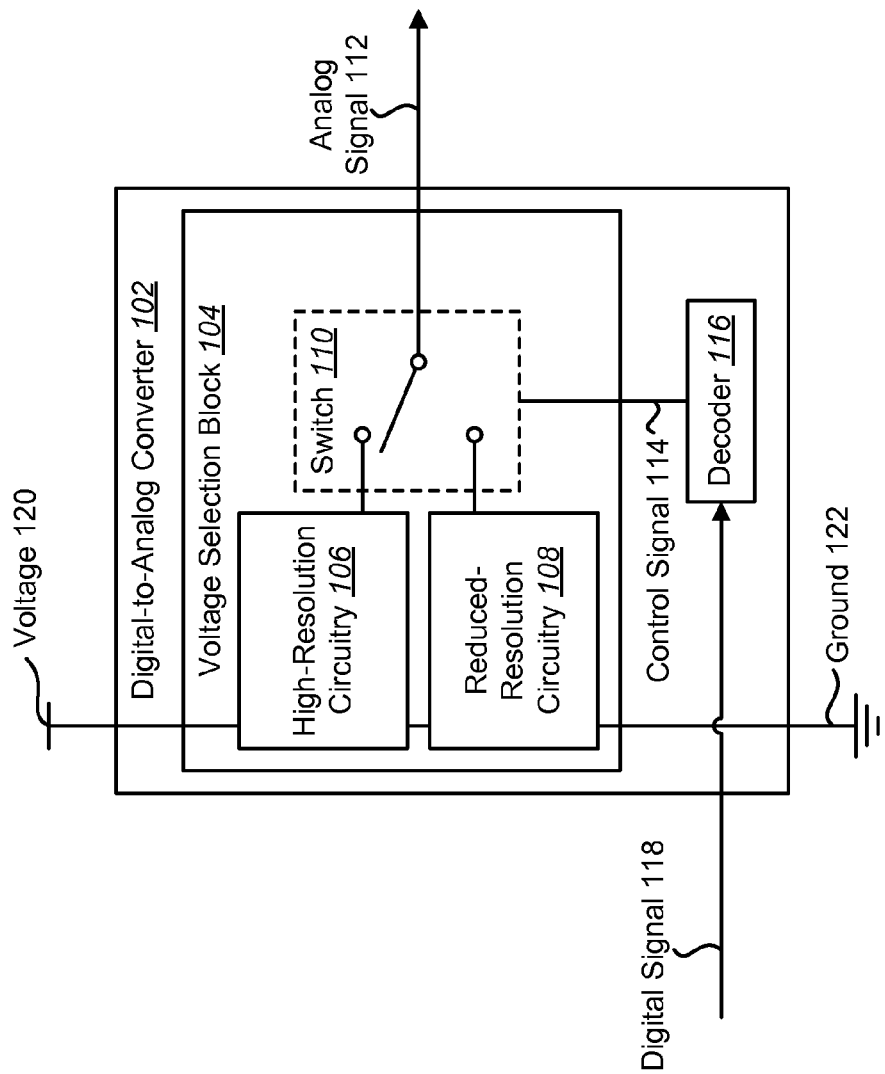
FIG. 1 is a block diagram illustrating one configuration of a Digital-to-Analog Converter (DAC) with non-uniform resolution.

It should be noted that the terms "couple," "coupling," "coupled" or other variations of the word "couple" as used herein may indicate either an indirect connection or a direct connection. For example, if a first component is "coupled" to a second component, the first component may be either indirectly connected to the second component (through another component, for example) or directly connected to the second component.

It should also be noted that the terms "correction," "correct," "correct for" or other variations of the word "correct" as used herein may denote at least an attempt to compensate or adjust for an error. For example, "correcting" an error may denote an attempt to compensate or adjust for an error and may or may not mean complete correction of the error.

The systems and methods disclosed herein may improve the performance and/or reduce the size of a Digital-to-Analog Converter (DAC). For example, the systems and methods disclosed herein may reduce the size and enhance or increase bandwidth for a high-resolution resistor-string DAC used in a digital phase-lock-loop (PLL).

A resistor-string DAC may be desirable for digital PLL applications because of its monotonic transfer function and low current consumption. For improved PLL noise performance, a higher DAC resolution may be required. In order to increase the DAC resolution for a resistor-string DAC, additional hardware may be needed, including unit resistor cells, switches and decoders. These additional components may lead to a larger area (e.g., an increase of one bit may double the area) and bandwidth degradation. Thus, it may be costly to increase DAC resolution.

In a digital PLL application, the DAC may need to process phase modulation signals that only need to exercise part of the DAC output range during modulation. Higher resolution may only be needed in that region. For example, the frequency deviation of a phase modulation signal is around 250 kilohertz (kHz) for Global System for Mobile Communications (GSM) specifications and 2.8 megahertz (MHz) for Enhanced Data Rates for GSM Evolution (EDGE) specifications. Assuming that a Voltage-Controlled Oscillator (VCO) has a tuning sensitivity or gain (e.g., denoted $K_v$) of 10 MHz/V (in MHz per Volt (V)), a modulator may utilize a DAC output voltage range of 25 millivolts (mV) for GSM and 280 mV for EDGE. Assume, for example, that the full-scale DAC output range is 0 to 1.8V and the modulation waveform is centered at 0.9V. During modulation, the DAC output voltage may stay in the region 0.9V±0.5×25 mV for GSM and 0.9V±0.5×0.28V for EDGE.

The systems and methods disclosed herein may use identified DAC operation characteristics to implement a high-resolution DAC with improved performance. This approach may reduce the area used to implement the DAC and improve bandwidth by reducing the DAC resolution (partially). A digital adjustment or correction technique may additionally or alternatively be applied according to the systems and methods disclosed herein. This digital adjustment or correction may be applied to or related to a DAC output or "Vtune" signal that is provided to a VCO.

As described above, the DAC resolution may be partially reduced. For example, only a portion of the DAC input codes may be used or exercised during operation. Thus, the high-resolution DAC output (e.g., Vtune) may only be required for a certain output range. The DAC resolution outside of this range may be reduced. This may reduce the number of components without sacrificing the PLL performance. This may reduce the (implementation) area and improve bandwidth.

Systems and methods for a digital Vtune adjustment procedure are disclosed herein. These may be used to ensure that a Vtune operating voltage is centered in a desired voltage range (e.g., a designated operating range) that has the highest DAC resolution. This may reduce the risk of operating in a reduced or low-resolution region. In some configurations, the systems and methods disclosed herein may be applied in situations where uniform DAC resolution is not a requirement. The systems and methods disclosed herein may be applied to a variety of DAC configurations, such as a single-stage DAC or multiple-stage DAC, for example. For instance, the systems and methods disclosed herein may be applied to a single-stage resistor-string DAC and VCO with a high DAC resolution requirement.

Other resistor-string DAC and VCO approaches have been used (e.g., in PLLs). However, a high-resolution DAC was not required in these approaches. Other approaches to implement high-resolution resistor-string DACs may be used for general applications where uniform DAC resolution is needed. Those approaches, such as DACs with multi-stage resistor strings, do not guarantee monotonicity.

One example of a resistor-string DAC with partially reduced resolution follows. For ease in understanding, a conventional resistor-string DAC will be described, followed by the resistor-string DAC with partially reduced resolution. Assume, for example, a conventional resistor-string DAC that includes $2^{11}$ unit resistors (e.g., denoted $R_u$). These $2^{11}$ unit resistors may be connected in series with each other between a voltage source (e.g., a supply voltage) and ground. This resistor-string DAC has a uniform resolution across its operating range. However, this resistor-string DAC may also require a relatively large amount of space (e.g., on an integrated circuit) for implementation.

The systems and methods disclosed herein describe a DAC with partially reduced and/or non-uniform resolution. In order to transition from the conventional approach, for example, the resistors may be divided into several groups while optimizing a unit resistance. In this example, assume that the DAC is a single-stage resistor-string DAC with a voltage source coupled to a series of two resistors, each having a resistance of $2^7 * R_u$. That series of resistors may comprise "reduced-resolution circuitry." It is coupled in series to a series of 256 resistors, each having a resistance of $2 * R_u$, which may also comprise "reduced-resolution circuitry."

That series of resistors is coupled in series to a series of 512 resistors, each having a resistance of $R_u$. The series of 512 resistors may comprise "high-resolution circuitry." It is coupled in series to another series of 256 resistors, each having a resistance of $2 * R_u$ (also reduced-resolution circuitry). That series of resistors is coupled in series to a series of two resistors, each having a resistance of $2^7 * R_u$ (also reduced-resolution circuitry), which is in turn coupled to ground. This resistor-string DAC may have a total resistance that is equivalent to the uniform conventional resistor-string DAC with $2^{11}$ unit resistors described above.

However, compared to the uniformly distributed resistor-string DAC, the non-uniform resistor-string DAC may reduce the required components and area by approximately 75% in this example. The resistors with higher resistance can be implemented as resistors with higher sheet resistance, thereby avoiding an increase in area.

The non-uniform resistor-string DAC may also have a non-uniform transfer function, which can be described in terms of input code versus output voltage. First and second "reduced-resolution" regions (corresponding to the reduced-resolution circuitry of two resistors of $2^7 * R_u$ each and the reduced-resolution circuitry of a series of 256 resistors of $2 * R_u$ each, for example) and fourth and fifth "reduced-resolution" regions (corresponding to the reduced-resolution circuitry of another series of 256 resistors of $2 * R_u$ each and the reduced-resolution circuitry of another two resistors of $2^7 * R_u$ each, for example) may have reduced-resolution to reduce the implementation area. A third "high-resolution" region (corresponding to the high-resolution circuitry of a series of 512 resistors, each having a resistance of $R_u$, for example) may provide higher resolution, which may be the desired operation region during use (e.g., during tracking in a PLL).

The systems and methods disclosed herein also describe a digital adjustment or "correction" algorithm. This procedure may be used or engaged when a DAC input code is out of the desired range, which can be calculated from the desired DAC output (e.g., "Vtune") range, for example. For example, assuming that 0.7V to 1.1V is the desired tuning range, if the DAC full-scale output is 1.8V, the engagement range would correspond to the input code of less than 797 or larger than 1251 (1024±(0.2/1.8)*2047). This assumes, for instance, an 11-bit input code representing values from 0 to 2047.

The adjustment or "correction" may be done by changing an "acquisition code" or an operating range control signal to compensate for the error in the DAC output or analog signal. A first adjustment may be computed as illustrated in Equation (1).

$$N_{A1} = \frac{K_{vco}(\text{Hz}/LSB) \times (N_{DAC\_1} - 1024)}{K_{acq}(\text{Hz}/LSB)}. \tag{1}$$

In Equation (1), $N_{A1}$ is a first adjustment (e.g., for the acquisition code or operating range control signal). More specifically, $N_{A1}$ is an amount of change in the acquisition code or operating range control signal. For example, assume that the initial acquisition code (e.g., operating range control signal) is $N_{initial\_acq}$. After a first adjustment, the (new) acquisition code (e.g., operating range control signal) will be $N_{initial\_acq} + N_{A1}$.

In Equation (1), $K_{vco}$ is a VCO gain or tuning sensitivity expressed in hertz (Hz) per least significant bit (LSB). More specifically, $K_{vco}$ may be expressed as $K_{vco} = K_v \times K_{dac}$, where $K_v$ is a VCO tuning sensitivity (in Hz/V, for example) and $$K_{dac} = \frac{Range_{dac\_V}}{Range_{dac\_LSB}}.$$

$Range_{dac\_V}$ is the voltage range of the DAC (e.g., 1.8V) and $Range_{dac\_LSB}$ is the code range of the DAC (e.g., 2047 for an 11-bit DAC) in units of least significant bits (LSB). Thus, $K_{vco}$ has units of Hz/LSB. $K_{acq}$ is a tuning sensitivity using the acquisition code or operating range control signal (also expressed in expressed in hertz (Hz) per least significant bit (LSB)). More specifically, $K_{acq}$ is a tuning sensitivity or gain of one acquisition code, meaning the amount of VCO frequency change when 1 LSB of acquisition code (e.g., operating range control signal) is changed, which may be expressed as $$\frac{\Delta F_{vco}}{LSB}.$$

$N_{DAC\_1}$ is a first DAC input code value. It should be noted that 1024 is used as an example in Equation (1). In this example, 1024 corresponds to the input code in the center of the desired or designated operating region. However, other values may be used in other configurations.

In Equation (1), ($N_{DAC\_1}$–1024) indicates how much LSB the DAC input code is deviated from the center (e.g., 1024 in an 11-bit case). $K_{vco}$(Hz/LSB)×($N_{DAC\_1}$–1024) indicates how much frequency the code deviation corresponds to. Thus, $N_{A1}$ basically indicates how much acquisition code (e.g., operating range control signal) needs to be changed in order to compensate for this frequency deviation. In other words, if the DAC input code is to be kept at 1024, $N_{A1}$ indicates how much how much acquisition code (e.g., operating range control signal) is needed to be changed to move the VCO output frequency to the desired value. It should be noted that the VCO output frequency may be changed through changing the DAC input code and/or the acquisition code (e.g., operating range control signal).

Accurate $K_{vco}$ and $K_{acq}$ information may not be available. Without accurate $K_{vco}$ and $K_{acq}$ information, the first adjustment or correction ($N_{A1}$) may not be accurate enough. After the first adjustment or correction ($N_{A1}$) is applied, a second adjustment may be used if the corrected DAC output (e.g., analog signal or Vtune) is still out of a desired (e.g., "safe") range. The second adjustment may be determined according to Equation (2), for example.

$$N_{A2} = \frac{K_{vco}(\text{Hz}/LSB) \times (N_{DAC\_2} - 1024)}{K_{acq}(\text{Hz}/LSB)} \quad (2)$$

In Equation (2), $N_{A2}$ is a second adjustment (e.g., for the acquisition code or operating range control signal), and $N_{DAC\_2}$ is a second DAC input code value. A PLL may automatically generate the second DAC input code value $N_{DAC\_2}$ in order to lock the VCO to a target frequency. It should be noted that 1024 is used as an example in Equation (2). In this example, 1024 corresponds to the input code in the center of the desired operating region. However, other values may be used in other configurations.

This second adjustment or correction gain ($N_{A2}$) may be scaled or adjusted with information from the previous adjustment or correction. An operating range control signal (e.g., acquisition code) may be adjusted by the scaled second adjustment ($\alpha N_{A2}$), where $\alpha$ is a scaling factor as illustrated in Equation (3).

$$\alpha = \frac{N_{A1}}{N_{A1} - N_{A2}} \quad (3)$$

Two cases may possibly occur. In a first case, the DAC input code may be within the desired or designated operating range with a first adjustment or correction. For example, the acquisition code or operating range control signal may be adjusted. Depending on the different acquisition code (e.g., operating range control signal), a closed-loop PLL may determine the DAC code in such a way that the VCO frequency is the same as the target frequency. In a second case, the DAC input code may still be outside of the desired range. A second adjustment or correction may then be applied with a gain factor calculated from the result of the first correction.

In one example of a first case, assume that the first DAC input code ($N_{DAC\_1}$) corresponds to 24 (e.g., –1000 from the "center" of 1024). A first command to adjust or correct may be +1000. Assume that the actual adjustment or correction applied in this case is +1000. In this case, the DAC input code is within the desired range with the first adjustment or correction. Thus, no additional adjustment or correction may be determined and/or applied.

In one example of the second case, assume that the first DAC input code ($N_{DAC\_1}$) corresponds to 24 (e.g., –1000 from the "center" of 1024). A first command to adjust or correct may be +1000. Assume that the actual adjustment or correction applied in this case is +400. In other words, the gain is too small to bring the DAC input code within the desired range after the first adjustment or correction. Thus, the adjustment or correction should be +600. $\alpha$=2.5 may be computed using the first adjustment or correction. The command for adjustment or correction may then be +600×2.5=+1500. This may then bring the DAC input code within the desired range with the second adjustment or correction.

In another example of the second case, assume that the first DAC input code ($N_{DAC\_1}$) corresponds to 24 (e.g., –1000 from the "center" of 1024). A first command to adjust or correct may be +1000. Assume that the actual adjustment or correction applied in this case is +1500. In other words, the gain is too large to bring the DAC input code within the desired range after the first adjustment or correction. Thus, the adjustment or correction should be –500. $\alpha$=0.67 may be computed using the first adjustment or correction. The command for adjustment or correction may then be –500×0.67=–335. This may then bring the DAC input code within the desired range with the second adjustment or correction.

Various configurations are now described with reference to the Figures, where like reference numbers may indicate functionally similar elements. The systems and methods as generally described and illustrated in the Figures herein could be arranged and designed in a wide variety of different configurations. Thus, the following more detailed description of several configurations, as represented in the Figures, is not intended to limit scope, as claimed, but is merely representative of the systems and methods.

FIG. 1 is a block diagram illustrating one configuration of a digital-to-analog converter (DAC) 102 with non-uniform resolution. The DAC 102 may be a circuit used to convert a digital signal 118 (e.g., digital code words, bits, etc.) into an analog signal 112. The DAC 102 may be coupled to a voltage 120 (e.g., supply voltage, voltage source, etc.) and to ground 122. The DAC 102 may include a voltage selection block 104 and/or one or more decoders 116. The voltage selection block 104 may include high-resolution circuitry 106, reduced-resolution circuitry 108 and/or one or more switches 110.

The one or more decoders 116 may receive and/or use a digital signal 118. For example, the digital signal 118 may include information indicating amplitude (e.g., voltage) levels. For example, a code word included in the digital signal 118 may indicate a particular voltage or amplitude. The one or more decoders 116 may use the digital signal 118 to generate a control signal 114. For example, the control signal 114 may be used to control the one or more switches 110. The one or more switches 110 may select a particular voltage or amplitude from the high-resolution circuitry 106 or the reduced-resolution circuitry 108.

In one configuration, the DAC 102 is a single-stage resistor-string DAC 102. In this configuration, the high-resolution circuitry 106 may be coupled to the reduced-resolution circuitry 108. The high-resolution circuitry 106 and/or the reduced-resolution circuitry 108 may be coupled to the voltage 120 and/or to ground 122. For example, the high-resolution circuitry 106 may comprise one or more resistors and the reduced-resolution circuitry 108 may comprise one or more resistors. The high-resolution circuitry 106 resistors may have smaller resistances compared to reduced-resolution circuitry 108 resistors, for example. Thus, the high-resolution circuitry 106 may provide smaller voltage increments than the reduced-resolution circuitry 108. For example, the one or more switches 110 may select or couple to a node along the resistor string to provide the voltage at that node. The analog signal 112 may be based on this voltage provided or selected by the one or more switches 110.

Figure 2:
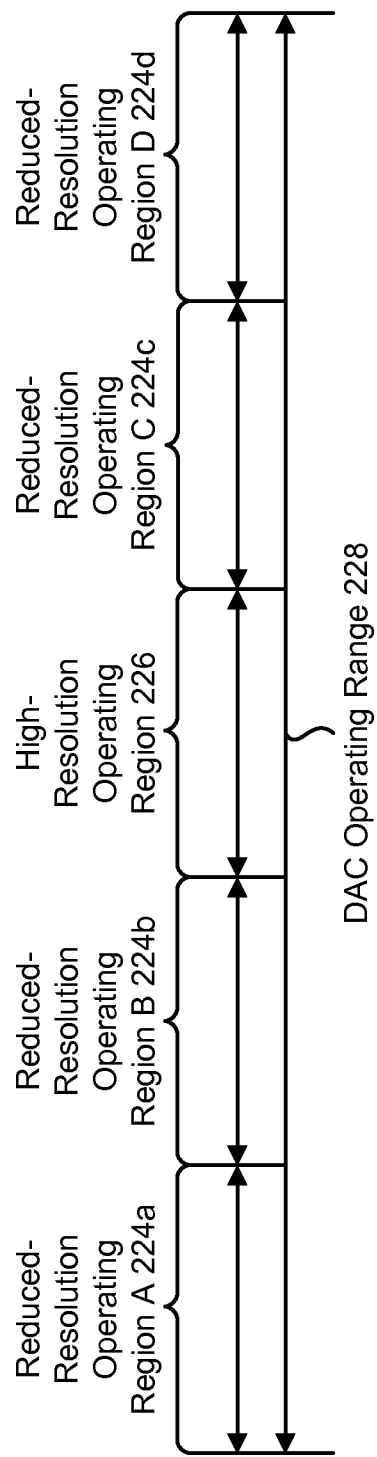
FIG. 2 is a diagram illustrating one example of a high-resolution operating region and multiple reduced-resolution operating regions across a Digital-to-Analog Converter (DAC) operating range.

FIG. 2 is a diagram illustrating one example of a high-resolution operating region 226 and multiple reduced-resolution operating regions 224a-d across a Digital-to-Analog Converter (DAC) 102 operating range 228. For example, a DAC 102 in accordance with the systems and methods disclosed herein may be a non-uniform DAC 102 including one or more high-resolution operating regions and/or one or more reduced-resolution operating regions. More specifically, one or more high-resolution operating regions 226 may be provided by high-resolution circuitry 106, while one or more reduced-resolution operating 224 regions may be provided by reduced-resolution circuitry 108.

In the example illustrated in FIG. 2, a DAC 102 has a high-resolution operating region 226 surrounded by reduced-resolution operating regions 224a-d across the DAC 102 operating range 228. In one configuration, the reduced-resolution operating regions 224a-d may provide larger steps in voltage compared to the high-resolution operating region 226. Furthermore, reduced-resolution operating regions 224a-d may differ from each other in the resolution provided. For example, reduced-resolution operating regions A 224a and D 224d may be provided by one or more resistors (in a series, for example) that have larger resistance than one or more resistors used for reduced-resolution operating regions B 224b and C 224c. In turn, the one or more resistors used for reduced-resolution operating regions B 224b and C 224c may be larger than the one or more resistors used for the high-resolution operating region 226. In this way, the number of resistors used in a DAC 102 may be reduced, while still providing high-resolution operation within a high-resolution operating region 226.

Figure 3:
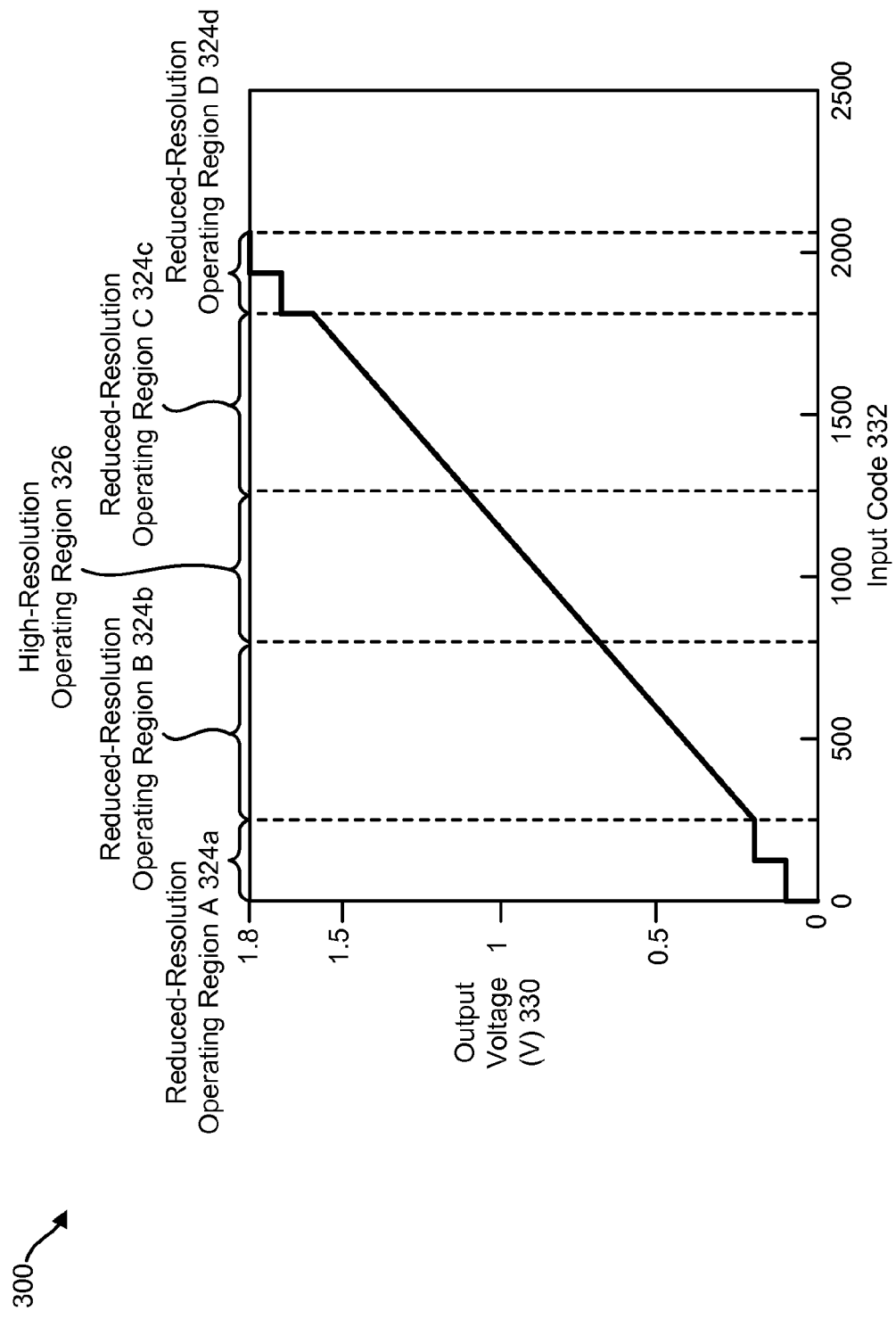
FIG. 3 is a graph illustrating another example of a high-resolution operating region and multiple reduced-resolution operating regions.

FIG. 3 is a graph 300 illustrating another example of a high-resolution operating region 326 and multiple reduced-resolution operating regions 324a-d. For example, a DAC 102 in accordance with the systems and methods disclosed herein may be a non-uniform DAC 102 including one or more high-resolution operating regions and/or one or more reduced-resolution operating regions. More specifically, one or more high-resolution operating regions 326 may be provided by high-resolution circuitry 106, while one or more reduced-resolution operating regions 324 may be provided by reduced-resolution circuitry 108.

The graph illustrated in FIG. 3 shows one example of a range of input codes 332 (from a digital signal 118, for example) corresponding to output voltages 330. In this example, the range of input codes 332 corresponds to an 11-bit number. More specifically, an 11-bit input code may represent a number from 0 to 2047 (e.g., $2^{11}-1$). The digital signal 118 discussed previously may convey this 11-bit input code to the one or more decoders 116 to select an output voltage 330 using the one or more switches 110, for example.

Each input code 332 may correspond to a particular voltage 330 across the operating range of the DAC 102. In this example, the operating range of the DAC 102 may correspond to a range of output voltages 330 from 0 to 1.8 volts (V). As illustrated in this example, the input codes 332 and their corresponding voltages 330 may be non-uniform across the operating range of the DAC 102. For instance, the DAC 102 may operate in reduced-resolution operating region A 324a, reduced-resolution operating region B 324b, a high-resolution operating region 326, reduced-resolution operating region C 324c and/or reduced-resolution operating region D 324d.

In this example, the high-resolution operating region 326 may include input code values between 768 (corresponding to an input code 332 of '01100000000 and 0.7V (e.g., 0.675V), for example) and 1279 (corresponding to an input code 332 of '10011111111' and 1.1V (e.g., 1.125V), for example) or approximately $$1024 \pm \left(\frac{0.2}{1.8}\right) \times 2047.$$

In the high-resolution operating region 326, 512 resistors of unit resistance (e.g., $R_u$) may be used to provide voltages (in steps) between approximately 0.7V and approximately 1.1V. These 512 resistors are one example of high-resolution circuitry 106. Reduced-resolution operating region A 324a may include input codes between 0 and 255. For example, input codes 0 to 127 may correspond to 0.1125V and input codes 128 to 255 may correspond to 0.225V. Two resistors with a resistance that is $2^7$ times a unit resistance (e.g., $2^7 * R_u$) each may be used to provide operation for reduced-resolution operating region A 324a. Similarly, input codes 1792 to 1919 may correspond to 1.6875V and input codes 1920 to 2047 may correspond to 1.8V for reduced-resolution operating region D 324d. These two resistors are one example of reduced-resolution circuitry 108. Furthermore, two resistors with a resistance that is $2^7$ times a unit resistance (e.g., $2^7 * R_u$) each may be used to provide operation for reduced-resolution operating region D 324d. These two resistors are another example of reduced-resolution circuitry 108.

Input codes from 256 to 767 may correspond to reduced-resolution operating region B 324b to provide voltages between 0.225V and 0.675V. In this region 324b, 256 resistors with a resistance that is two times a unit resistance (e.g., $2*R_u$) may be used to provide voltages (in steps) between 0.225V and 0.675V. These 256 resistors are another example of reduced-resolution circuitry 108. Similarly, input codes from 1280 to 1791 may correspond to reduced-resolution operating region C 324c to provide voltages between 1.125V and 1.575V. In this region 324c, 256 resistors with a resistance that is two times a unit resistance (e.g., $2*R_u$) may be used to provide voltages in steps between 1.125V and 1.575V. These 256 resistors are yet another example of reduced-resolution circuitry 108. For example, high-resolution circuitry 106 may provide an output in finer increments (or the smallest increments available on a DAC 102) than reduced-resolution circuitry 108, which may provide an output in coarser increments.

Figure 4:
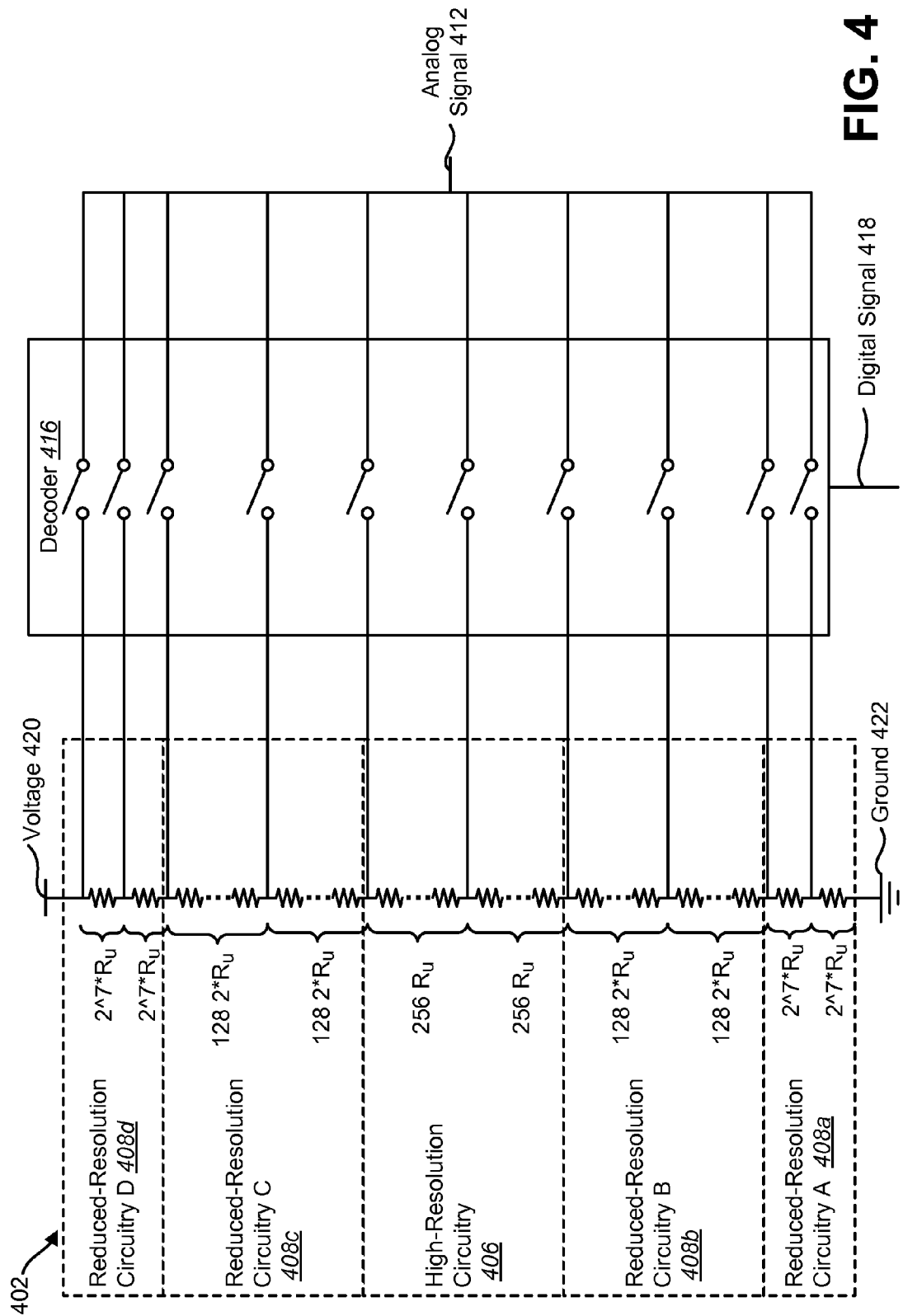
FIG. 4 is a diagram illustrating one example of a Digital-to-Analog Converter (DAC) with non-uniform resolution.

FIG. 4 is a diagram illustrating one example of a Digital-to-Analog Converter (DAC) 402 with non-uniform resolution. More specifically, FIG. 4 illustrates a single-stage resistor-string DAC 402 with non-uniform resolution. The DAC 402 (e.g., the resistor-string) may be coupled to a voltage 420 and ground 422. The DAC 402 may include reduced-resolution circuitry A 408a, reduced-resolution circuitry B 408b, high-resolution circuitry 406, reduced-resolution circuitry C 408c and reduced-resolution circuitry D 408d. The DAC 402 may also include one or more decoders 416 that operate one or more switches. As illustrated in FIG. 4, each of the switches may be coupled to high-resolution circuitry 406 or reduced-resolution circuitry 408a-d at nodes along the resistor string. Thus, when one of the switches is closed, the DAC 402 outputs a particular voltage as an analog signal 412. In one configuration, the decoder 416 may be an X-Y decoder used to decode input digital signals 418 such that the number of required switches can be reduced. By using an X-Y decoder, for example, only 64+32=96 switches may be used (instead of using 2048 switches). In this configuration, there is still one combination for X-Y for each code.

The one or more decoders 416 may use a digital signal 418 (e.g., digital code words, input code, bits, etc.) to control the switches. For example, assume that the decoder 416 may use a digital signal 418 conveying an 11-bit number. This 11-bit input code may represent a value or number from 0 to 2047 (e.g., $2^{11}-1$). The one or more decoders 416 may use the digital signal 418 to control the switches in order to select a voltage at a node that the DAC 402 may provide as an analog signal 412. Of course, the analog signal 412 may comprise a sequence of voltages based on the input digital signal 418 (e.g., a series of code words over time).

Each input code of the digital signal 418 may correspond to a particular voltage across the operating range of the DAC 402. For example, assume that the operating range of the DAC 402 corresponds to a range of output voltages from 0V to 1.8V. As illustrated in FIG. 4, the input codes and their corresponding voltages may be non-uniform across the operating range of the DAC 402.

In this example, the one or more decoders 416 may control switches to nodes of the high-resolution circuitry 406. For example, input codes (from the digital signal 418) between 768 (e.g., '01100000000') and 1279 (e.g., '10011111111') correspond to nodes with voltages between approximately 0.7V (e.g., 0.675V) and approximately 1.1V (e.g., 1.125V). Thus, the difference in voltage between adjacent nodes (e.g., step) in the high-resolution circuitry 406 may be less than 1 millivolt (mV) (e.g., approximately 0.879 mV). For example, the high-resolution circuitry 406 may include 512 resistors of unit resistance (e.g., $R_u$) used to provide voltages (in steps) between 0.675V and 1.125V.

The one or more decoders 416 (which may only be a single decoder 416 to translate the input digital signal 418 to corresponding control signals for each switch in some configurations) may also control switches to nodes of reduced-resolution circuitry A 408a or reduced-resolution circuitry A 408a. For example, input codes (from the digital signal 418) between 0 and 255 may be used to control switches for reduced-resolution circuitry A 408a. For example, input codes 0 to 127 may correspond to 0.1125V and input codes 128 to 255 may correspond to 0.225V. Two resistors with a resistance that is 2 times a unit resistance (e.g., $2^7*R_u$) each may be used in reduced-resolution circuitry A 408a. As can be observed, the difference in voltages between adjacent nodes in reduced-resolution circuitry A 408a is 0.1125V in this example.

The one or more decoders 416 may also control switches to nodes of reduced-resolution circuitry D 408d. For example, input codes (from the digital signal 418) between 1792 and 1919 may correspond to approximately 1.6875V and input codes 1920 to 2047 may correspond to 1.8V. Two resistors with a resistance that is $2^7$ times a unit resistance (e.g., $2^7*R_u$) each may be used in reduced-resolution circuitry D 408d. As can be observed, the difference in voltages between adjacent nodes (e.g., steps) in reduced-resolution circuitry D 408d is 0.1125V in this example.

The one or more decoders 416 may use input codes (from the digital signal 418) from 256 to 767 to control switches for reduced-resolution circuitry B 408b to provide voltages between 0.225V and approximately 0.7V (e.g., 0.675V). Two-hundred fifty-six (256) resistors in reduced-resolution circuitry B 408b, each with a resistance that is two times a unit resistance (e.g., $2*R_u$), may be used to provide voltages (in steps) between 0.225V and 0.675V. The difference in voltages between adjacent nodes in reduced-resolution circuitry B 408b is approximately 1.758671 mV in this example.

The one or more decoders 416 may use input codes (from the digital signal 418) from 1280 to 1791 to control switches for reduced-resolution circuitry C 408c to provide voltages between 1.125V and 1.575V. Two-hundred fifty-six (256) resistors in reduced-resolution circuitry C 408c, each with a resistance that is two times a unit resistance (e.g., $2*R_u$), may be used to provide voltages (in steps) between approximately 1.1V (e.g., 1.125V) and 1.575V. The difference in voltages between adjacent nodes in reduced-resolution circuitry C 408c is approximately 1.758671 mV in this example. For example, high-resolution circuitry 106 may provide an output in finer increments (e.g., approximately 0.879 mV or the smallest increments available on a DAC 402) than reduced-resolution circuitry 408a-d, which may provide an output in coarser increments (e.g., 1.758671 mV for reduced-resolution circuitry B 408b and C 408c and 0.1125V for reduced-resolution circuitry A 408a and D 408d). Table (1) summarizes the operation of the DAC according to voltage ranges, DAC code and step size. Corresponding labels for high-resolution circuitry 406 and reduced-resolution circuitry 408a-d are also provided, along with a region number.

TABLE 1

| Label | Region | High Voltage (V) | Low Voltage (V) | DAC code | Step (mV) |
|---|---|---|---|---|---|
| 408d | 8 | 1.8 | 1.575 | 2047 | 112.5 |
| 408c | 7 | 1.575 | 1.35 | 1791 | 1.758671 |
|  | 6 | 1.35 | 1.125 | 1535 |  |
| 406 | 5 | 1.125 | 0.9 | 1279 | 0.879336 |
|  | 4 | 0.9 | 0.675 | 1023 |  |
| 408b | 3 | 0.675 | 0.45 | 767 | 1.758671 |
|  | 2 | 0.45 | 0.225 | 511 |  |
| 408a | 1 | 0.225 | 0 | 255 | 112.5 |

Figure 5:
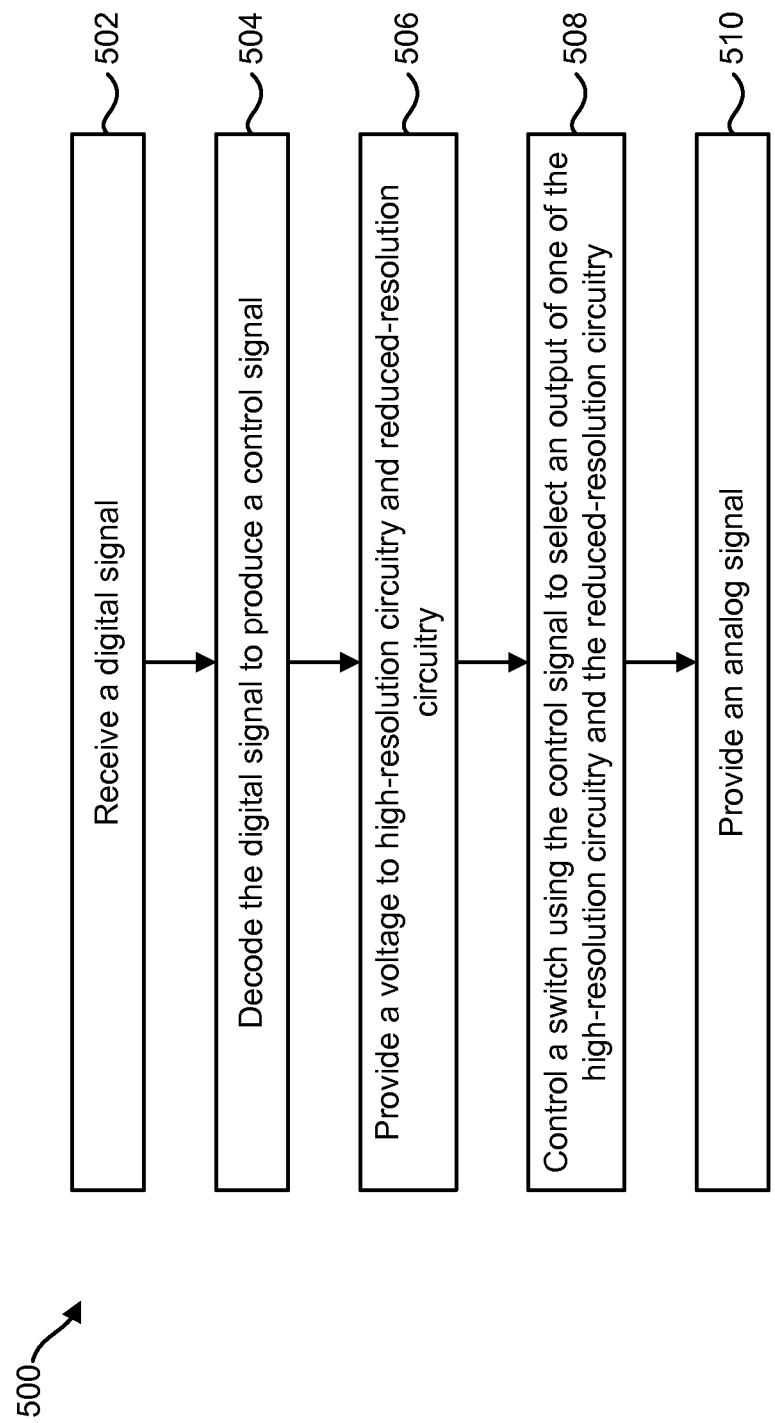
FIG. 5 is a flow diagram illustrating one configuration of a method for converting a digital signal into an analog signal using a Digital-to-Analog Converter (DAC) with non-uniform resolution.

FIG. 5 is a flow diagram illustrating one configuration of a method 500 for converting a digital signal into an analog signal using a Digital-to-Analog Converter (DAC) with non-uniform resolution. A DAC 102 may receive 502 a digital signal 118. For example, a digital signal 118 (e.g., digital code words, bits, etc.) may be input into the DAC 102. The DAC 102 may decode 504 the digital signal 118 to produce a control signal 114. For example, one or more decoders 116 on the DAC 102 may decode 504 the digital signal 118 to produce a control signal 114 that may be used to control one or more switches 110.

The DAC 102 may provide 506 a voltage 120 to high-resolution circuitry 106 and reduced-resolution circuitry 108. For example, the DAC 102 may provide 506 a source or supply voltage 120 to the high-resolution circuitry 106 and the reduced-resolution circuitry 108.

The DAC 102 may control 508 a switch 110 using the control signal 114 to select an output or node of one of the high-resolution circuitry 106 and the reduced-resolution circuitry 108. For example, the high-resolution circuitry 106 and the reduced-resolution circuitry 108 may each have one or more outputs or nodes. The control signal 114 may control one or more switches 110 to select one of these outputs. For instance, the control signal 114 uses a switch 110 to couple one of the outputs (of the high-resolution circuitry 106 or reduced-resolution circuitry 108) to a DAC 102 output node. Thus, the voltage that is available at the selected output or node of the high-resolution circuitry 106 or reduced-resolution circuitry 108 is provided at the output (node) of the DAC 102.

The DAC 102 may then provide 510 an analog signal 112. The analog signal 112 may be provided 510 at an output node of the DAC 102. For example, the analog signal 112 may comprise a voltage that is selected by the switch 110. The analog signal 112 may further comprise a series of voltages provided by the DAC 102. For example, the DAC 102 may receive a digital signal 118 that comprises a series or sequence of code words. Each of these code words may be decoded 504 in turn, thereby producing a control signal 114 that controls the one or more switches 110 in a sequence according to the code words. Thus, a sequence of voltages comprising the analog signal 112 may be provided 510 at the output of the DAC 102.

Figure 6:
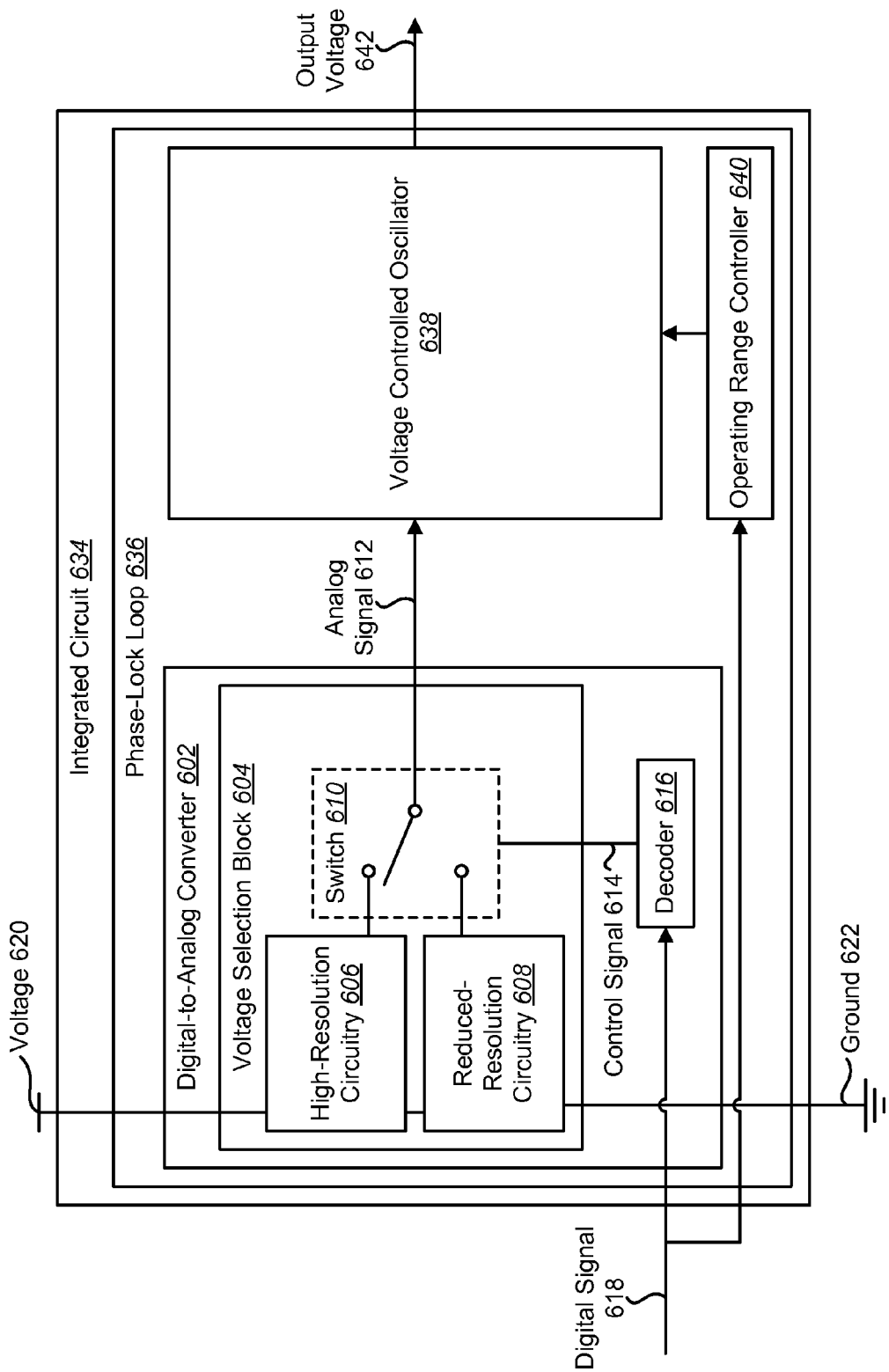
FIG. 6 is a block diagram illustrating one configuration of an integrated circuit wherein a Digital-to-Analog Converter (DAC) with non-uniform resolution with operating range control may be implemented.

FIG. 6 is a block diagram illustrating one configuration of an integrated circuit 634 wherein a Digital-to-Analog Converter (DAC) with non-uniform resolution with operating range control may be implemented. The integrated circuit 634 may include a phase-lock loop (PLL) 636. A phase-lock loop 636 may be used to control the phase of one signal based on the phase of another signal (e.g., reference signal). The phase-lock loop 636 may include a DAC 602, a Voltage-Controlled Oscillator (VCO) 638 and an operating range controller 640.

The DAC 602 may include one or more decoders 616 and a voltage selection block 604. The voltage selection block 604 may include high-resolution circuitry 606, reduced-resolution circuitry 608 and one or more switches 610. The integrated circuit 634 (and/or the DAC 602) may be coupled to a voltage 620 and to ground 622. The DAC 602 may convert a digital signal 618 into an analog signal 612. The decoder 616 may use the digital signal 618 to produce a control signal 614. The control signal 614 may control one or more switches 610 to select an output or node of the high-resolution circuitry 606 or reduced-resolution circuitry 608. This may produce the analog signal 612 (e.g., DAC 602 output or "Vtune").

The DAC 602 may be coupled to a Voltage-Controlled Oscillator (VCO) 638. The VCO 638 may generate an output voltage 642. More specifically, the VCO 638 may generate an oscillating signal at a frequency based on an analog signal 612 voltage. The output voltage 642 may be output as a differential signal. It should be noted that the digital signal 618 may originate from the integrated circuit 634 and/or the output voltage 642 may be provided to another block or module on the integrated circuit 634 in some configurations. In other configurations, the digital signal 618 may be received from a separate circuit or electronic device and/or the output voltage 642 may be provided to a separate circuit or electronic device.

As described above, the DAC 602 may include high-resolution circuitry 606 and reduced-resolution circuitry 608. This allows the DAC 602 to provide high-resolution operation (e.g., within a certain range) while reducing the number of components needed to implement the DAC 602. While operating in certain circumstances (e.g., when the PLL 636 is "locked," during modulation, etc.), it may be desirable for the PLL 636 to provide only high-resolution operation (within a certain range, for example).

Figure 7:
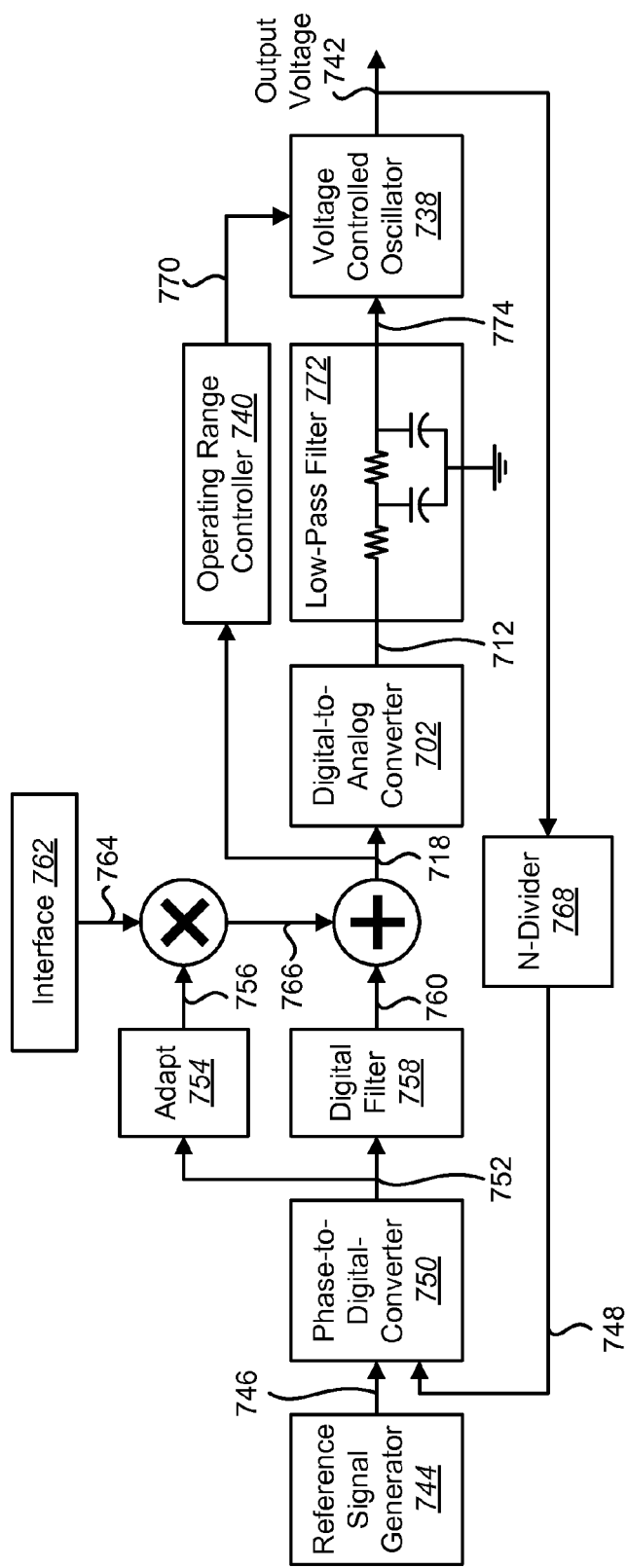
FIG. 7 is a block diagram illustrating an example of one implementation of a Digital-to-Analog Converter (DAC) with non-uniform resolution and an operating range controller.

The operating range controller 640 may be a software and/or hardware module used to adjust (e.g., "correct") VCO 638 operation when the digital signal 618 input code word is outside of a designated operating region (e.g., the high-resolution operating region). For example, if the digital signal 618 input code word corresponds to an operating region outside of the designated or desired operating region (e.g., in a reduced-resolution operating region corresponding to the reduced-resolution circuitry 608), the analog signal 612 output from the DAC 602 (e.g., "Vtune") may contain an error, being outside of the desired operating range. The operating range controller 640 may detect that the digital signal 618 code word is outside of a range of desirable input code words (corresponding to a high-resolution operating region, for example). The operating range controller 640 may then adjust or compensate for (e.g., "correct") the error in the analog signal 612 by controlling VCO 638 operation. For example, the operating range controller 640 controls an acquisition code or operating range signal for this adjustment or compensation. Thus, for example, the VCO 638 operation may be adjusted FIG. 7 is a block diagram illustrating an example of one implementation of a Digital-to-Analog Converter (DAC) 702 with non-uniform resolution and an operating range controller 740. More specifically, FIG. 7 illustrates several blocks and/or modules that may be used in conjunction with the DAC 702 and operating range controller 740. In one configuration, the modules and/or blocks illustrated in FIG. 7 may be used in conjunction with or as part of a modulator. For example, the DAC 702, operating range controller 740 and the voltage controlled oscillator 738 may be used in a modulator in a wireless communication device (e.g., cellular phone, smart phone, etc.). A reference signal generator 744 may output a reference signal 746 at a particular phase (and frequency). A Phase-to-Digital Converter (PDC) 750 may use the reference signal 746 and an N-divided feedback signal 748 to generate a phase-difference digital output 752 (that indicates the phase difference between the reference signal 746 and the N-divided feedback signal 748).

The phase-difference digital output 752 may be fed into an adapt block 754 and a digital filter 758. The adapt block 754 adjusts scaling for the input signals from an interface block 762 based on the VCO gain (e.g., $K_v$ in Hz/V). The adapt block 754 uses the phase-difference digital output 752 to produce a scaling signal 756. An interface block 762 may be used to deal with digital signals that are incoming from a baseband chip. For example, the interface block 762 may be used to filter and resample the incoming digital signals. The interface block 762 output signal 764 may be multiplied with the scaling signal 756 to produce modulation signals with correct scaling 766.

The digital filter 758 provides some digital filtering for the phase-difference digital output 752 to produce a digital filter output 760. The digital filter output 760 may be summed with the scaled modulation signal 766 to produce a digital signal 718. The digital signal 718 may be fed into the DAC 702 and the operating range controller 740. The DAC 702 converts the digital signal 718 into an analog signal 712. A low-pass filter 772 may optionally be used to smooth the analog signal 712, producing a smoothed analog signal 774. The smoothed analog signal 774 may be input into a Voltage-Controlled Oscillator (VCO) 738.

The VCO 738 may generate an output voltage 742 based on the analog signal 712 (or smoothed analog signal 774, for example). For example, the VCO 738 may produce an output voltage 742 or signal that oscillates at a frequency based on the input analog signal 712 (or smoothed analog signal 774, for example). The output voltage 742 may be input into an N-divider 768. The N-divider 768 may divide the frequency of output voltage (e.g., an oscillating signal) by a factor of N to produce the N-divided feedback signal 748.

The operating range controller 740 may use the digital signal 718 to produce an operating range control signal 770. For example, the operating range controller 740 may detect whether the digital signal 718 includes a code word that is outside of a designated range (e.g., outside of a high-resolution operating region). If the code word is outside of the desirable range, the operating range control 740 may produce the operating range control signal 770 in order to adjust or compensate for an error in the analog signal 712 (and/or the smoothed analog signal 774) in the VCO 738.

Figure 8:
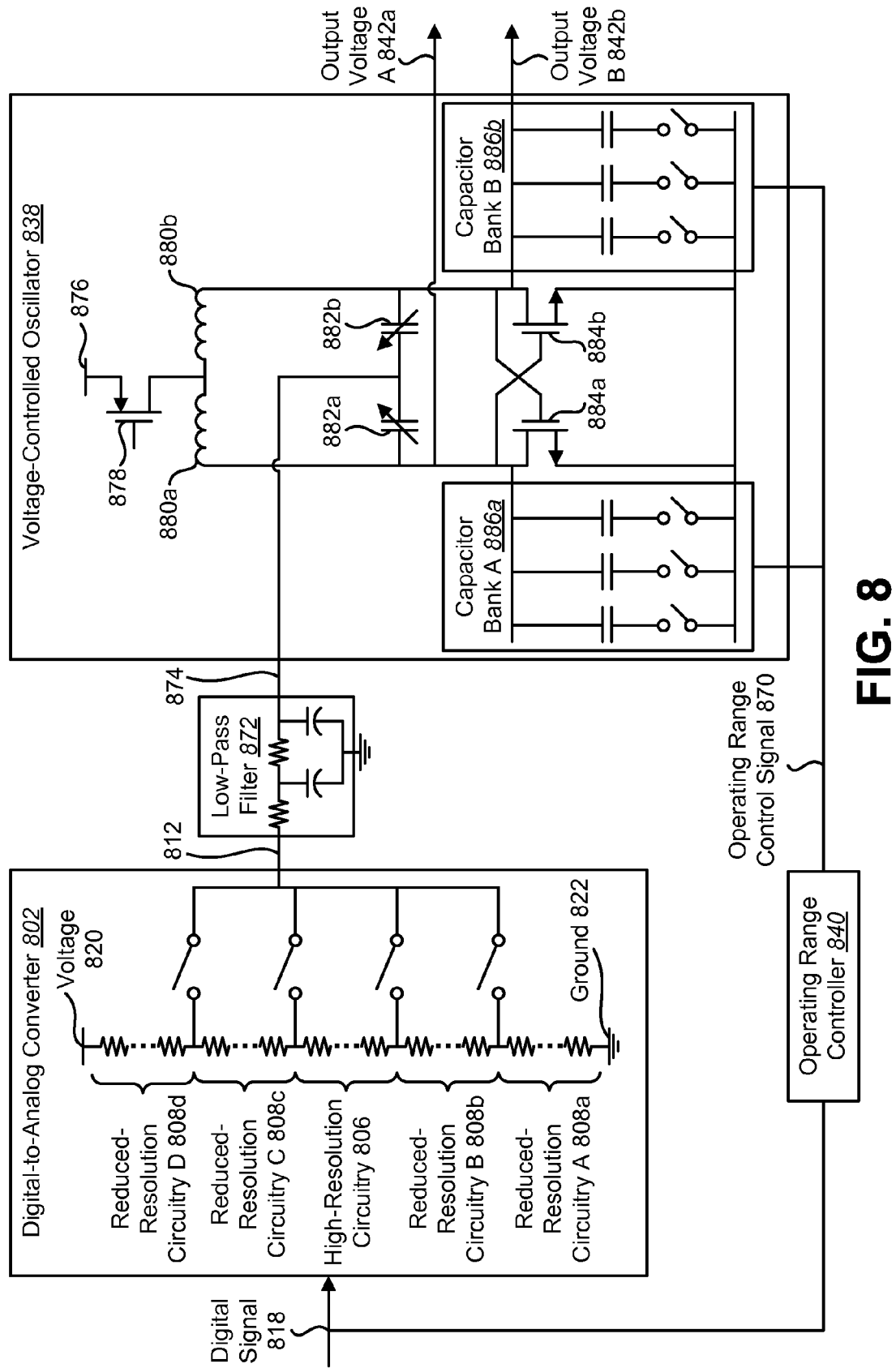
FIG. 8 is a block diagram illustrating a more specific example of a Digital-to-Analog Converter (DAC) and an operating range controller.

FIG. 8 is a block diagram illustrating a more specific example of a Digital-to-Analog Converter (DAC) 802 and an operating range controller 840. In this example, the DAC 802 is a single-stage resistor-string DAC 802. A multi-stage DAC may alternatively be used. The DAC 802 includes high-resolution circuitry 806, reduced-resolution circuitry A-D 808*a-d* and several switches. The DAC 802 is coupled to a voltage 820 and to ground 822. As illustrated, the DAC 802 may be a non-uniform DAC 802, having high-resolution circuitry 806 and reduced-resolution circuitry 808*a-d*. The DAC 802 converts a digital signal 818 into an analog signal 812. The analog signal 812 may be passed through a low-pass filter 872 to produce a smoothed analog signal 874.

The DAC 802 (and/or the low-pass filter 872) may be coupled to a Voltage-Controlled Oscillator (VCO) 838. The VCO 838 may be coupled to a voltage 876 (which may be different from or the same as voltage 820) and may include a transistor 878 and a pair of inductors 880*a-b* for operation. The VCO 838 may also include a pair of varactors 882*a-b* (e.g., variable capacitors) and cross-coupled transistors 884*a-b*.

The analog signal 812 (or the smoothed analog signal 874) may be coupled to the varactors 882*a-b*. This analog signal 812, 874 may control the VCO 838. For example, the VCO 838 may produce output voltages A and B 842*a-b* based on the analog signal 812, 874. The output voltages 842*a-b* may be differential signals, where one is an inverted version of the other. The analog signal 812, 874 may control the frequency of the output voltages or signals 842*a-b*.

The digital signal 818 may also be input into the operating range controller 840. The operating range controller 840 may be a software and/or hardware module used to adjust or compensate for errors in the analog signal 812. The errors in the analog signal 812 may be adjusted or compensated for by controlling one or more capacitor banks 886*a-b* included in the VCO 838 using an operating range control signal 870. For example, capacitor banks A and B 886*a-b* may each include one or more capacitors and switches. The capacitor banks A and B 886*a-b* may be referred to as a single capacitor bank.

The operating range control signal 870 (e.g., acquisition code) may control the capacitor bank switches to change the operation of the VCO 838. For example, an acquisition code or operating range control signal 870 may be adjusted, which changes an acquisition capacitor bank 886*a-b* in the VCO 838. In one configuration, for example, the VCO 838 output frequency may be expressed as $$F_{vco} = \frac{1}{(2\pi\sqrt{LC})},$$

where L is the inductance of the inductors 880*a-b* and C is the total capacitance of the capacitors (including the varactors 882*a-b* and capacitors in the capacitor banks 886*a-b*). Thus, by changing the capacitance of the capacitor banks 886*a-b*, C will change and $F_{vco}$, will change. The operating range control signal 870 may be generated based on the digital signal 818 and VCO 838 characteristics.

The operating range controller 840 may determine whether the digital signal 818 (e.g., a code word) corresponds to an analog signal 812 that is outside of a designated range. For example, each code word conveyed by the digital signal 818 may correspond to a particular voltage (e.g., analog signal 812) output by the DAC 802. The VCO 838 may generate a signal (e.g., output voltages A-B 842*a-b*) at a particular frequency based on the voltage (e.g., analog signal 812). However, in some applications, only a particular range of frequencies may need to be used.

In one digital PLL application, for example, the DAC 802 may need to process phase modulation signals that only need to exercise part of the DAC 802 output range during modulation. Higher resolution may only be needed in that region. For example, the frequency deviation of a phase modulation signal is around 250 kilohertz (kHz) for Global System for Mobile Communications (GSM) specifications and 2.8 megahertz (MHz) for Enhanced Data Rates for GSM Evolution (EDGE) specifications. Assuming that a VCO has a tuning sensitivity or gain (e.g., denoted $K_v$) of 10 MHz/V (in MHz per Volt (V)), a modulator may utilize a DAC 802 output voltage 812 range of 25 millivolts (mV) for GSM and 280 mV for EDGE. In one configuration, for example, the full-scale DAC 802 output range is 0 to 1.5V and the modulation waveform is centered at 0.75V. During modulation, the DAC output voltage 812 may stay in the region 0.75V±0.5×25 mV for GSM and 0.75V±0.5×0.28V for EDGE in that case.

The operating range controller 840 may employ a digital adjustment or "correction" procedure. This procedure may be used or engaged when a DAC 802 input code 818 is outside of a designated or desired range. The designated range may be calculated from the designated or desired DAC 802 output or analog signal range. For example, assuming that 0.7V to 1.1V is the designated tuning range, if the DAC 802 full-scale output is 1.8V, the engagement range would correspond to the input code (from the digital signal 818) of less than 797 or larger than 1251 (1024±(0.2/1.8)*2047). This assumes, for example, an 11-bit input code representing values from 0 to 2047.

The adjustment or "correction" may be done by changing an "acquisition code" or an operating range control signal 870 to compensate for error in the analog signal 812. A first adjustment may be computed as illustrated in Equation (4).

$$N_{A1} = \frac{K_{vco}(\text{Hz}/LSB) \times (N_{DAC\_1} - \text{Center})}{K_{acq}(\text{Hz}/LSB)} \quad (4)$$

In Equation (4), $N_{A1}$ is a first adjustment (e.g., for the acquisition code or operating range control signal 870). More specifically, $N_{A1}$ is an amount of change in the acquisition code or operating range control signal. For example, assume that the initial acquisition code (e.g., operating range control signal 870) is $N_{initial\_acq}$. After a first adjustment, the (new) acquisition code (e.g., operating range control signal 870) will be $N_{initial\_acq} + N_{A1}$. $K_{vco}$ is a VCO 838 gain or tuning sensitivity expressed in hertz (Hz) per least significant bit (LSB), $K_{acq}$ is a tuning sensitivity or gain using the acquisition code or operating range control signal 870, $N_{DAC\_1}$ is a first DAC input code value (e.g., a value corresponding to a code word from the digital signal 818) and Center is a code value corresponding to the center of the designated operating region (e.g., 1024 when the DAC input code ranges from 0-2047).

Accurate $K_{vco}$ and $K_{acq}$ information may not be available. Without accurate $K_{vco}$ and $K_{acq}$ information, the first adjustment or correction ($N_{A1}$) may not be accurate enough. After the first adjustment or correction ($N_{A1}$) is applied, a second adjustment may be used if the corrected DAC 802 output or analog signal 812 is still out of a desired (e.g., "safe") range (assuming that the DAC 802 transfer function is linear, for example). In some configurations, this second adjustment may be triggered based on a second DAC input code value (e.g., a value corresponding to a code word from the (updated) digital signal 818). The second adjustment may be determined according to Equation (5), for example.

$$N_{A2} = \frac{K_{vco}(\text{Hz}/LSB) \times (N_{DAC\_2} - \text{Center})}{K_{acq}(\text{Hz}/LSB)} \quad (5)$$

In Equation (5), $N_{A2}$ is a second adjustment (e.g., for the acquisition code or operating range control signal 870), and $N_{DAC\_2}$ is a second DAC input code (value). For example, a PLL may automatically generate the (updated or second) DAC code (e.g., $N_{DAC\_2}$) to lock the VCO frequency to the target frequency according to the (new) acquisition code $N_{initial\_acq} \pm N_{A1}$. This second DAC code (e.g., $N_{DAC\_2}$) or updated digital signal 818 may be used to trigger the second adjustment. For example, the operating range controller 840 may determine if the updated digital signal 818 or (updated or second) DAC input code is still outside of a desired range (and/or corresponds to a DAC 802 output or analog signal 812 that is still outside of a desired range).

This second adjustment or correction gain ($N_{A2}$) may be scaled or adjusted with information from the previous adjustment or correction. The operating range control signal 870 (e.g., acquisition code) may be adjusted by the scaled second adjustment ($\alpha N_{A2}$), where $\alpha$ is a factor as illustrated in Equation (6).

$$\alpha = \frac{N_{A1}}{N_{A1} - N_{A2}} \quad (6)$$

Two cases may possibly occur. In a first case, the DAC input code may be within the desired range with a first adjustment or correction. In a second case, the DAC input code may still be outside of the desired range. A second adjustment or correction may then be applied with a gain factor calculated from the result of the first correction.

In one example of a first case, assume that the first DAC input code ($N_{DAC\_1}$) corresponds to 24 (e.g., -1000 from the "center" of 1024). A first command to adjust or correct may be +1000. Assume that the actual adjustment or correction applied in this case is +1000. In this case, the (updated) DAC input code (e.g., $N_{DAC\_2}$) is within the desired range with the first adjustment or correction. Thus, no additional adjustment or correction may be determined and/or applied.

In one example of the second case, assume that the first DAC input code ($N_{DAC\_1}$) corresponds to 24 (e.g., -1000 from the "center" of 1024). A first command to adjust or correct may be +1000. Assume that the actual adjustment or correction applied in this case is +400. In other words, the gain is too small to bring the DAC input code within the desired range after the first adjustment or correction. Thus, the adjustment or correction should be +600. $\alpha=2.5$ may be computed using the first adjustment or correction. The command for adjustment or correction may then be +600×2.5=+1500. This may then bring the DAC input code within the desired range with the second adjustment or correction.

In another example of the second case, assume that the first DAC input code ($N_{DAC\_1}$) corresponds to 24 (e.g., -1000 from the "center" of 1024). A first command to adjust or correct may be +1000. Assume that the actual adjustment or correction applied in this case is +1500. In other words, the gain is too large to bring the DAC input code within the desired range after the first adjustment or correction. Thus, the adjustment or correction should be -500. $\alpha=0.67$ may be computed using the first adjustment or correction. The command for adjustment or correction may then be -500×0.67=-335. This may then bring the DAC input code within the desired range with the second adjustment or correction.

Figure 9:
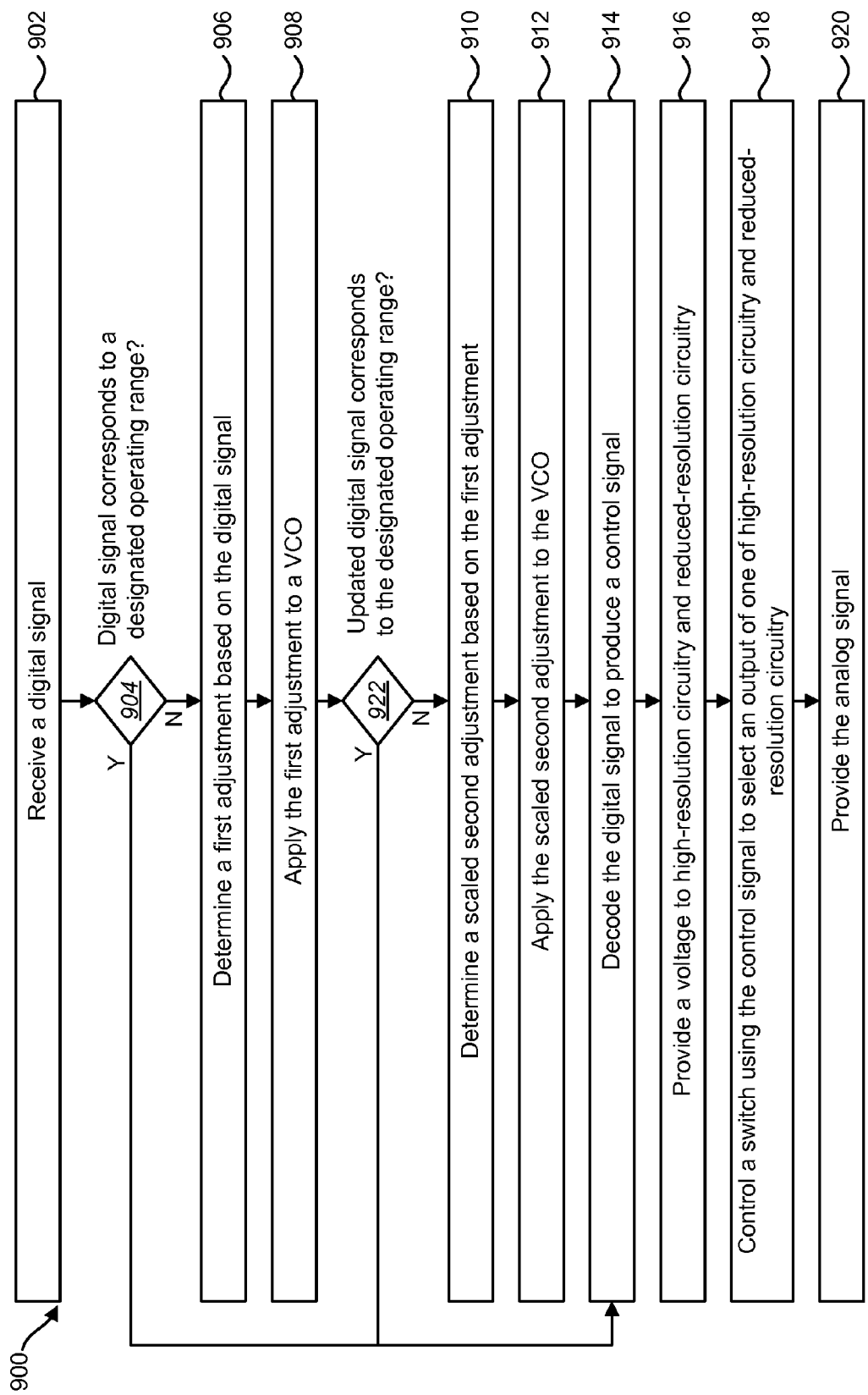
FIG. 9 is a flow diagram illustrating one configuration of a method for adjusting an operating range.

FIG. 9 is a flow diagram illustrating one configuration of a method 900 for adjusting an operating range. A circuit 634 (e.g., an operating range controller 640) may receive 902 a digital signal 618 (e.g., digital code word, bits, etc.). The circuit 634 may determine 904 whether the digital signal 618 corresponds to a designated operating range. For example, assume that the digital signal 618 (e.g., the DAC 602 input) comprises an 11-bit code word that is capable of representing 2048 values (e.g., 0 to 2047). Further assume that the full-scale operating range of the DAC 602 is 0V to 1.8V and that the desired operating range is from approximately 0.7V to 1.1V. Thus, the designated operating range may be represented by code words for values between 797 and 1251 (e.g., (1024±(0.2/1.8)*2047)). In this case, the circuit 634 may determine 904 whether the digital signal 618 (e.g., a code word) indicates a value between 797 and 1251.

If the digital signal 618 corresponds a value within the designated operating range (e.g., between 797 and 1251), the circuit 634 (e.g., DAC 602) may decode 914 the digital signal 618 to produce a control signal 614. For example, one or more decoders 616 on the circuit 634 may decode 914 the digital signal 618 to produce a control signal 614 that may be used to control one or more switches 610.

The circuit 634 may provide 916 a voltage 620 to high-resolution circuitry 606 and reduced-resolution circuitry 608. For example, the circuit 634 may provide 916 a source or supply voltage 620 to the high-resolution circuitry 606 and the reduced-resolution circuitry 608.

The circuit 634 (e.g., DAC 602) may control 918 a switch 610 using the control signal 614 to select an output of one of the high-resolution circuitry 606 and the reduced-resolution circuitry 608. For example, the high-resolution circuitry 606 and the reduced-resolution circuitry 608 may each have one or more outputs or nodes. The control signal 614 may control one or more switches 610 to select one of these outputs. For instance, the control signal 614 uses a switch 610 to couple one of the outputs (of the high-resolution circuitry 606 or reduced-resolution circuitry 608) to a DAC 602 output node. Thus, the voltage that is available at the selected output or node of the high-resolution circuitry 606 or reduced-resolution circuitry 608 is provided at the output (node) of the DAC 602.

The circuit 634 may then provide 920 an analog signal 612 (e.g., Vtune to the VCO 638). The analog signal 612 may be provided 920 at an output node of the DAC 602. For example, the analog signal 612 may comprise a voltage that is selected by the switch 610. The analog signal 612 may further comprise a series of voltages provided by the DAC 602. For example, the DAC 602 may receive a digital signal 618 that comprises a series or sequence of code words. Each of these code words may be decoded 914 in turn, thereby producing a control signal 614 that controls the one or more switches 610 in a sequence according to the code words. Thus, a sequence of voltages comprising the analog signal 612 may be provided 920 at the output of the DAC 602.

If the digital signal 618 (e.g., code word) does not correspond to the designated operating range (e.g., it is less than 797 or greater than 1251), the circuit 634 (e.g., operating range controller 640) may determine 906 a first adjustment based on the digital signal 618. For example, the first adjustment ($N_{A1}$) may be computed or calculated as illustrated in Equation (4) above. The circuit 634 may apply 908 the first adjustment to a VCO 638 (using an operating range control signal, for example). In one configuration, this may update the digital signal 618 to produce an updated digital signal 618. For example, a PLL may automatically generate the updated digital signal 618 or second DAC input code to lock the VCO 634 frequency to the target frequency according to the operating range control signal. This updated digital signal 618 or second DAC input code may be used to trigger a second adjustment. The circuit 634 (e.g., operating range controller 640) may determine 922 whether the updated digital signal 618 (e.g., second DAC input or updated DAC input) corresponds to or is within the designated operating range (e.g., a "safe" operating range). For instance, the circuit 634 may determine whether the second code word corresponds to the designated operating range (e.g., it is less than 797 or greater than 1251).

If the updated digital signal 618 (e.g., second DAC 602 input) is within the designated operating range, the circuit 634 (e.g., DAC 602) may decode 914 the (updated) digital signal 618 to produce a control signal 614. For example, one or more decoders 616 on the circuit 634 may decode 914 the digital signal 618 to produce a control signal 614 that may be used to control one or more switches 610.

The circuit 634 may provide 916 a voltage 620 to high-resolution circuitry 606 and reduced-resolution circuitry 608. For example, the circuit 634 may provide 916 a source or supply voltage 620 to the high-resolution circuitry 606 and the reduced-resolution circuitry 608. The circuit 634 (e.g., DAC 602) may control 918 a switch 610 using the control signal 614 to select an output of one of the high-resolution circuitry 606 and the reduced-resolution circuitry 608. The voltage that is available at the selected output or node of the high-resolution circuitry 606 or reduced-resolution circuitry 608 is provided at the output (node) of the DAC 602. The circuit 634 may then provide 920 an analog signal 612 (to the VCO 638, for example). The analog signal 612 may be provided 920 at an output node of the DAC 602. For example, the analog signal 612 may comprise a voltage that is selected by the switch 610.

If the updated digital signal 618 (e.g., second DAC 602 input) is not within the designated operating range, the circuit 634 may determine 910 a scaled second adjustment (e.g., $\alpha N_{A2}$) based on the first adjustment. For example, the scaled second adjustment may be computed or calculated using Equations (5) and (6) illustrated above. The circuit 634 (e.g., operating range controller 640) may apply 912 the scaled second adjustment (e.g., $\alpha N_{A2}$) to the VCO 638 (e.g., to the operating range control signal 870).

The circuit 634 (e.g., DAC 602) may decode 914 the (updated) digital signal 618 to produce a control signal 614 (that may be used to control one or more switches 610). The circuit 634 may provide 916 a voltage 620 to high-resolution circuitry 606 and reduced-resolution circuitry 608. The circuit 634 (e.g., DAC 602) may control 918 a switch 610 using the control signal 614 to select an output of one of the high-resolution circuitry 606 and the reduced-resolution circuitry 608. The circuit 634 may then provide 920 an analog signal 612 (to the VCO 638, for example).

Figure 10:
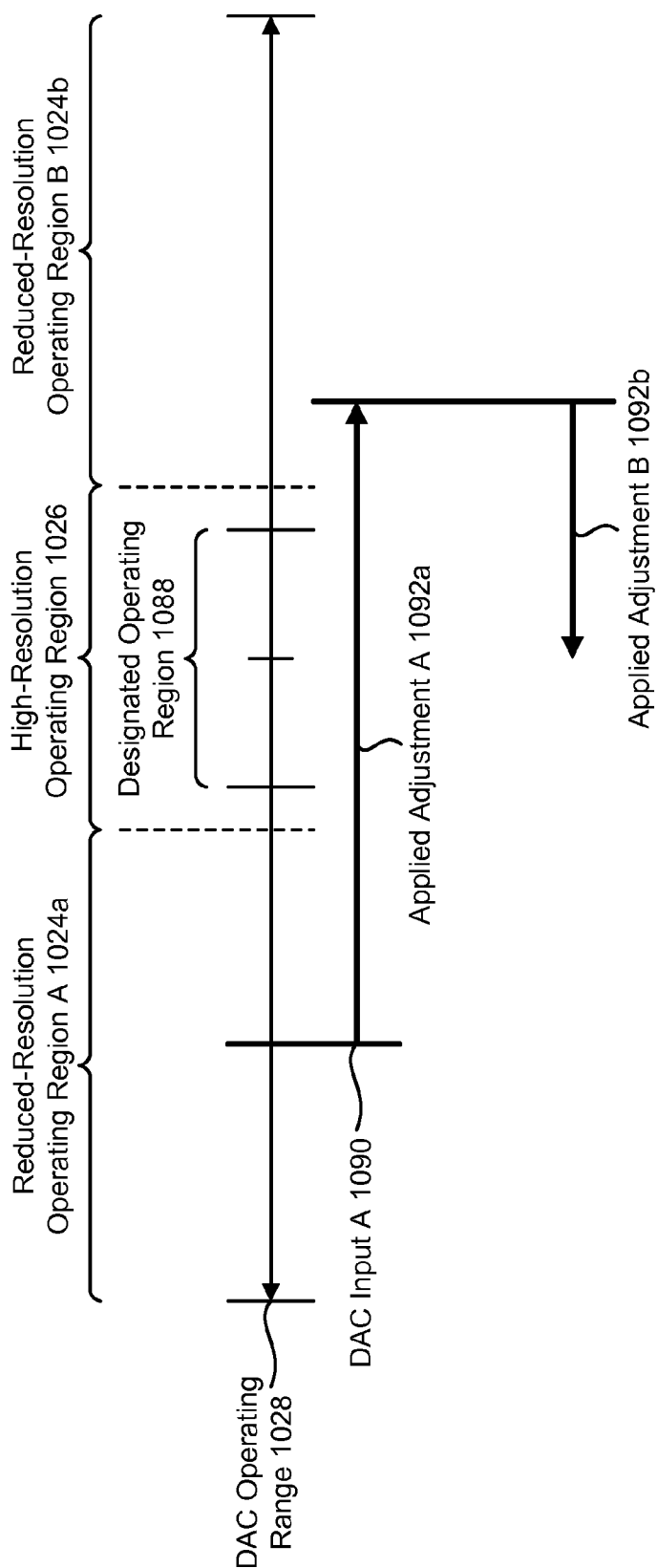
FIG. 10 is a diagram illustrating one example of operating range adjustments according to the systems and methods disclosed herein.

FIG. 10 is a diagram illustrating one example of operating range adjustments according to the systems and methods disclosed herein. The diagram in FIG. 10 illustrates a DAC operating range 1028. The DAC operating range 1028 may be expressed in terms of output voltages (e.g., 0V to 1.8V) or in terms of DAC input code (e.g., 0 to 2047 represented by an 11-bit code word). As described above, the DAC operating range 1028 may be divided into different operating regions. For example, the DAC operating range 1028 may include a high-resolution operating region 1026, reduced-resolution operating region A 1024a and reduced-resolution operating region B 1024b. A designated operating region 1088 may correspond to the high-resolution operating region 1026. In some configurations, the designated operating region 1088 may cover the same range as the high-resolution operating region 1026. In other configurations, the designated operating region 1088 may be a smaller range within the high-resolution operating region 1026. In yet other configurations, the designated operating region 1088 may encompass a range larger than the high-resolution operating region 1026.

For example, assume that reduced-resolution operating region A 1024a corresponds to a voltage range of 0V to 0.7V or a DAC input code range of 0 to 796. Further assume that the high-resolution operating region 1026 and the designated operating region 1088 correspond to a voltage range of 0.7V to 1.1V or a DAC input code range of 797 to 1251, with a center code of 1024. Also assume that reduced-resolution region B 1024b corresponds to a voltage range of 1.1V to 1.8V or a DAC input code range of 1252 to 2047.

In this example, assume that a first DAC input code ($N_{DAC\_1}$) or DAC input A 1090 is a value of 24 (e.g., −1000 from the "center" of 1024). A first command to adjust or correct may be +1000. Assume that the actual adjustment or applied adjustment A 1092a in this case is +1500. In other words, the gain is too large to bring the DAC input code within the desired range after the first adjustment or correction. Thus, the adjustment or correction should be −500. $\alpha$=0.67 may be computed using the first adjustment or correction. Applied adjustment B 1092b (e.g., $\alpha N_{A2}$) may then be −500×0.67=−335. This may then bring the DAC input code within the designated operating region 1088 with the second adjustment (applied adjustment B 1092b).

Figure 11:
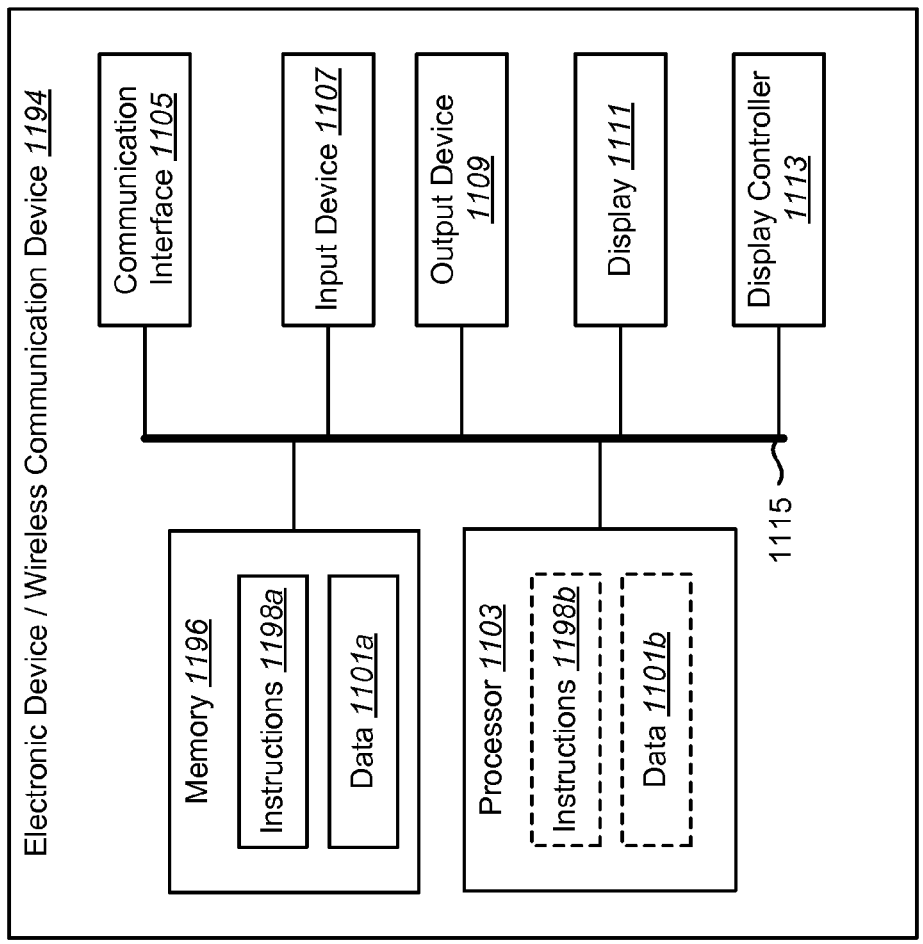
FIG. 11 illustrates various components that may be utilized in an electronic device/wireless communication device.

FIG. 11 illustrates various components that may be utilized in an electronic device/wireless communication device 1194. The illustrated components may be located within the same physical structure or in separate housings or structures. The DACs 102, 402, 602, 702, 802 and/or operating range controllers 640, 740, 840 described above may be implemented within the electronic device/wireless communication device 1194. The electronic device/wireless communication device 1194 includes a processor 1103. The processor 1103 may be a general purpose single- or multi-chip microprocessor (e.g., an ARM), a special purpose microprocessor (e.g., a digital signal processor (DSP)), a microcontroller, a programmable gate array, etc. The processor 1103 may be referred to as a central processing unit (CPU). Although just a single processor 1103 is shown in the electronic device/wireless communication device 1194 of FIG. 11, in an alternative configuration, a combination of processors (e.g., an ARM and DSP) could be used.

The electronic device/wireless communication device 1194 also includes memory 1196 in electronic communication with the processor 1103. That is, the processor 1103 can read information from and/or write information to the memory 1196. The memory 1196 may be any electronic component capable of storing electronic information. The memory 1196 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers and so forth, including combinations thereof.

Data 1101a and instructions 1198a may be stored in the memory 1196. The instructions 1198a may include one or more programs, routines, sub-routines, functions, procedures, etc. The instructions 1198a may include a single computer-readable statement or many computer-readable statements. The instructions 1198a may be executable by the processor 1103 to implement one or more of the methods 500, 900 that were described above. Executing the instructions 1198a may involve the use of the data 1101a that is stored in the memory 1196. FIG. 11 shows some instructions 1198b and data 1101b being loaded into the processor 1103.

The electronic device/wireless communication device 1194 may also include one or more communication interfaces 1105 for communicating with other electronic devices. The communication interfaces 1105 may be based on wired communication technology, wireless communication technology, or both. Examples of different types of communication interfaces 1105 include a serial port, a parallel port, a Universal Serial Bus (USB), an Ethernet adapter, an IEEE 1394 bus interface, a small computer system interface (SCSI) bus interface, an infrared (IR) communication port, a Bluetooth wireless communication adapter, and so forth. It should be noted that a wireless communication device 1194 may additionally include one or more antennas, transmitters and/or receivers (not shown in FIG. 11) for communicating wirelessly with other devices.

The electronic device/wireless communication device 1194 may also include one or more input devices 1107 and one or more output devices 1109. Examples of different kinds of input devices 1107 include a keyboard, mouse, microphone, remote control device, button, joystick, trackball, touchpad, lightpen, etc. Examples of different kinds of output devices 1109 include a speaker, printer, etc. One specific type of output device 1109 which may be typically included in an electronic device/wireless communication device 1194 is a display device 1111. Display devices 1111 used with configurations disclosed herein may utilize any suitable image projection technology, such as a cathode ray tube (CRT), liquid crystal display (LCD), light-emitting diode (LED), gas plasma, electroluminescence, or the like. A display controller 1113 may also be provided, for converting data stored in the memory 1196 into text, graphics, and/or moving images (as appropriate) shown on the display device 1111.

The various components of the electronic device/wireless communication device 1194 may be coupled together by one or more buses, which may include a power bus, a control signal bus, a status signal bus, a data bus, etc. For simplicity, the various buses are illustrated in FIG. 11 as a bus system 1115. It should be noted that FIG. 11 illustrates only one possible configuration of an electronic device/wireless communication device 1194. Various other architectures and components may be utilized.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL) or wireless technologies such as infrared, radio and microwave, then the coaxial cable, fiber optic cable, twisted pair, DSL or wireless technologies such as infrared, radio and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A circuit, comprising:
a resistor-based digital-to-analog converter with non-uniform resolution for converting a digital signal into an analog signal, comprising:
high-resolution circuitry;
reduced-resolution circuitry coupled to the high-resolution circuitry;
a switch coupled to the high-resolution circuitry and to the reduced-resolution circuitry, wherein the switch couples one of the high-resolution circuitry and the reduced-resolution circuitry to an output node; and
a decoder coupled to the switch, wherein the decoder receives the digital signal to control the switch.

2. The circuit of claim 1, wherein the reduced-resolution circuitry comprises a first resistor with a resistance that is greater than a resistance of a second resistor included in the high-resolution circuitry.

3. The circuit of claim 2, wherein the first resistor has a higher sheet resistance than the second resistor.

4. The circuit of claim 1, wherein the digital-to-analog converter is a single-stage resistor-string digital-to-analog converter.

5. The circuit of claim 1, wherein the high-resolution circuitry comprises a first plurality of resistors and the reduced-resolution circuitry comprises a second plurality of resistors, wherein the first plurality of resistors each have a resistance that is smaller than the resistance of each of the second plurality of resistors.

6. The circuit of claim 1, wherein the circuit is an integrated circuit.

7. The circuit of claim 1, wherein the decoder is an X-Y decoder.

8. A method for converting a digital signal into an analog signal using a resistor-based digital-to-analog converter with non-uniform resolution, comprising:

receiving a digital signal;
decoding, by the resistor-based digital-to-analog converter, the digital signal to produce a control signal;
providing a voltage to high-resolution circuitry and reduced-resolution circuitry;
controlling, by the digital-to-analog converter, a switch using the control signal to select an output from one of the high-resolution circuitry and the reduced-resolution circuitry; and
providing an analog signal.

9. The method of claim 8, wherein the reduced-resolution circuitry comprises a first resistor with a resistance that is greater than a resistance of a second resistor included in the high-resolution circuitry.

10. The method of claim 9, wherein the first resistor has a higher sheet resistance than the second resistor.

11. The method of claim 8, wherein the digital-to-analog converter is a single-stage resistor-string digital-to-analog converter.

12. The method of claim 8, wherein the high-resolution circuitry comprises a first plurality of resistors and the reduced-resolution circuitry comprises a second plurality of resistors, wherein the first plurality of resistors each have a resistance that is smaller than the resistance of each of the second plurality of resistors.

13. The method of claim 8, wherein the digital-to-analog converter is an integrated circuit.

14. The method of claim 8, wherein the digital-to-analog converter comprises an X-Y decoder.

15. An apparatus for converting a digital signal into an analog signal, comprising:
means for receiving a digital signal;
means for decoding the digital signal to produce a control signal;
means for providing a voltage to high-resolution circuitry and reduced-resolution circuitry;
means for controlling a switch using the control signal to select an output from one of the high-resolution circuitry and the reduced-resolution circuitry; and
means for providing an analog signal.

16. The apparatus of claim 15, wherein the reduced-resolution circuitry comprises a first resistor with a resistance that is greater than a resistance of a second resistor included in the high-resolution circuitry.

17. The apparatus of claim 15, wherein the high-resolution circuitry and the reduced-resolution circuitry comprise a single-stage resistor-string digital-to-analog converter.

* * * * *